(12) United States Patent
Rönkkä et al.

(10) Patent No.: US 8,904,315 B2
(45) Date of Patent: Dec. 2, 2014

(54) CIRCUIT ARRANGEMENTS AND ASSOCIATED APPARATUS AND METHODS

(75) Inventors: Risto Rönkkä, Tampere (FI); Tapio Manninen, Tampere (FI); Kalle Rutanen, Tampere (FI); Pekka Ruusuvuori, Lempäälä (FI); Heikki Huttunen, Tampere (FI)

(73) Assignee: Nokia Corporation, Espoo (FI)

( * ) Notice: Subject to any disclaimer, the term of this patent is extended or adjusted under 35 U.S.C. 154(b) by 185 days.

(21) Appl. No.: 11/958,280

(22) Filed: Dec. 17, 2007

(65) Prior Publication Data
US 2009/0158232 A1   Jun. 18, 2009

(51) Int. Cl.
  *G06F 17/50*   (2006.01)
  *H05K 3/22*    (2006.01)
  *H01L 23/00*   (2006.01)
  *H05K 3/32*    (2006.01)
  *H05K 1/18*    (2006.01)
  *H05K 3/00*    (2006.01)
  *H05K 1/02*    (2006.01)

(52) U.S. Cl.
  CPC ...... H05K 3/225 (2013.01); *H05K 2201/09118* (2013.01); *H01L 2924/01082* (2013.01); *H05K 2203/163* (2013.01); H01L 24/24 (2013.01); *H05K 1/183* (2013.01); *H01L 2924/01006* (2013.01); *H01L 2924/01033* (2013.01); *H05K 3/0005* (2013.01); H05K 3/32 (2013.01); *H01L 2924/01074* (2013.01); *H01L 2924/01047* (2013.01); *H05K 1/0269* (2013.01); *H05K 2203/013* (2013.01); *H01L 2224/76155* (2013.01); *H05K 2203/1469* (2013.01); H05K 1/185 (2013.01); *H01L 2224/24137* (2013.01)

USPC .............. 716/54; 716/51; 716/52; 716/53; 716/55; 716/112; 382/145; 382/146; 382/147; 382/151

(58) Field of Classification Search
USPC ......... 716/12–15, 50–56, 106, 111, 112, 126; 382/145, 146, 147, 151
See application file for complete search history.

(56) References Cited

U.S. PATENT DOCUMENTS

| | | | |
|---|---|---|---|
| 6,853,744 B2 * | 2/2005 | Mueller et al. | 382/147 |
| 2003/0177450 A1 * | 9/2003 | Nugent | 716/1 |
| 2003/0208740 A1 * | 11/2003 | Tourne et al. | 716/20 |
| 2004/0049912 A1 * | 3/2004 | Akagawa et al. | 29/846 |
| 2005/0141150 A1 * | 6/2005 | Bentley et al. | 361/2 |
| 2006/0263930 A1 | 11/2006 | Ito | |
| 2007/0092128 A1 | 4/2007 | Noy et al. | |
| 2007/0162888 A1 * | 7/2007 | Melvin III et al. | 716/21 |
| 2009/0145641 A1 * | 6/2009 | Daniel et al. | 174/258 |

FOREIGN PATENT DOCUMENTS

CN   1902755 A   1/2007

OTHER PUBLICATIONS

International Search Report for PCT Application No. PCT/EP2008/009624 mailed Mar. 9, 2009.

* cited by examiner

*Primary Examiner* — Nha Nguyen
(74) *Attorney, Agent, or Firm* — Harrington & Smith

(57) ABSTRACT

There is provided a method comprising: examining the location of one or more feature(s) of the one or more component(s) of a circuit arrangement to determine the displacement of the location of said one or more associated communication contact(s) with respect to a designed location for the communication contact(s), and providing corrective communication path layout data of said circuit arrangement based upon the said displacement(s).

26 Claims, 15 Drawing Sheets

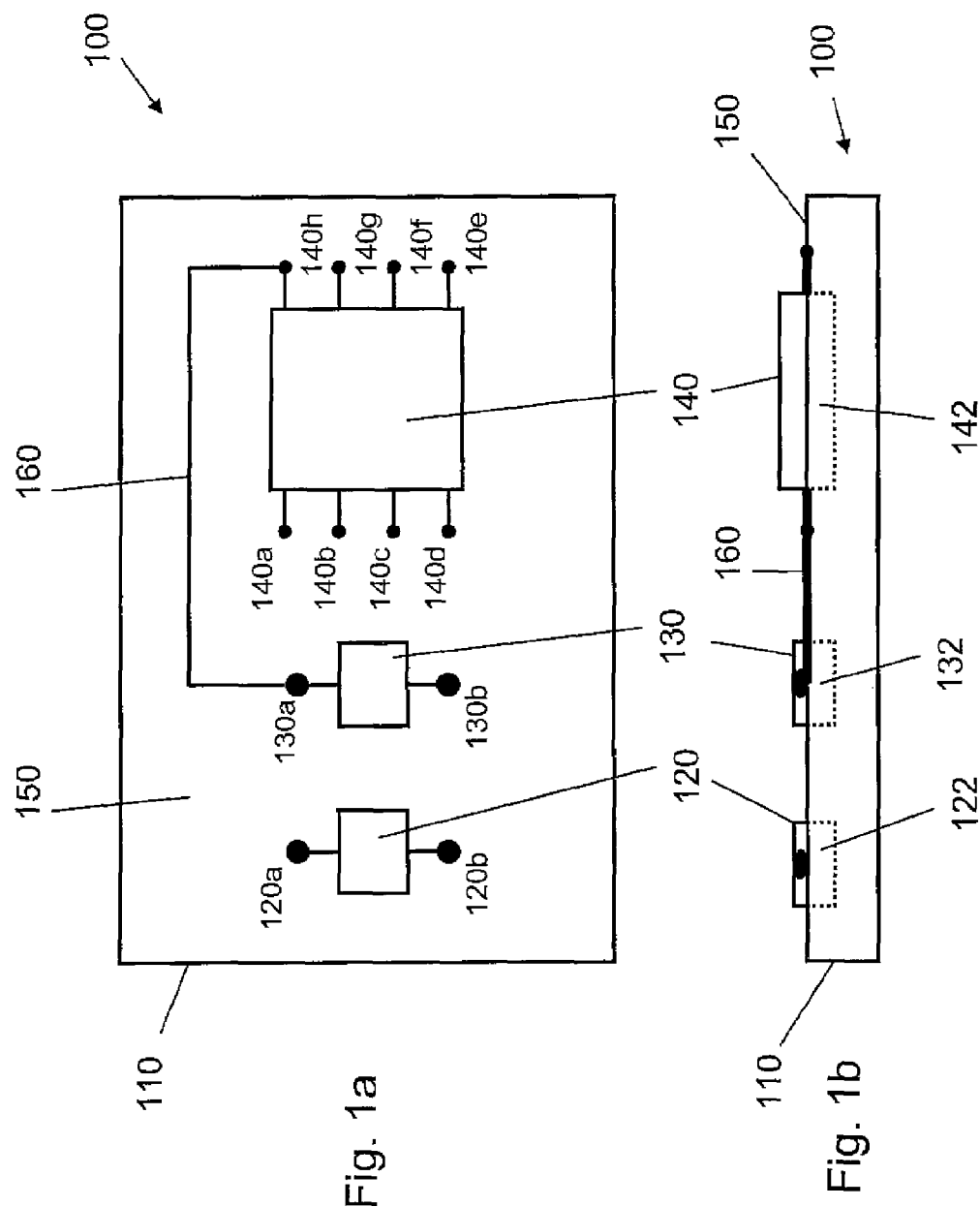

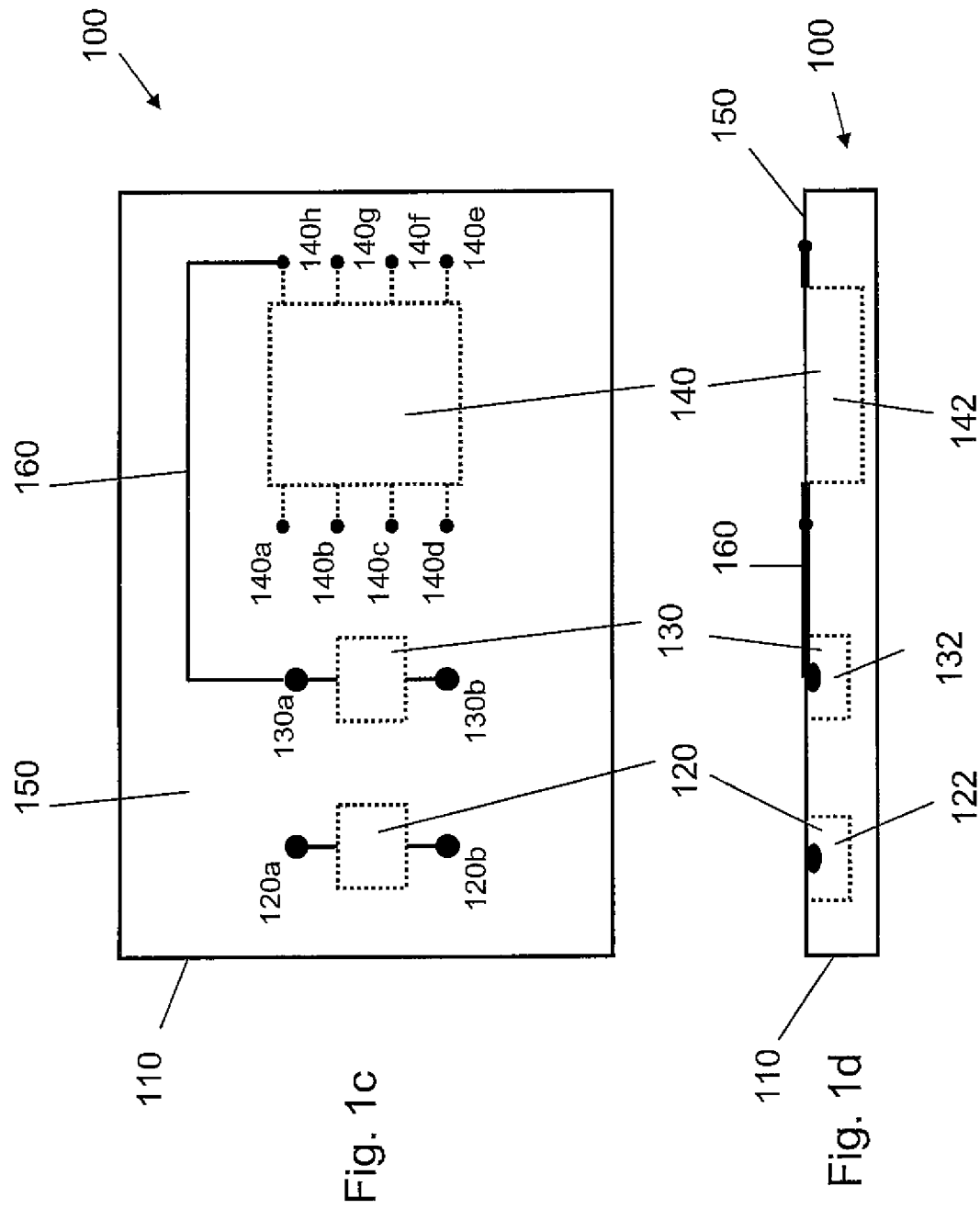

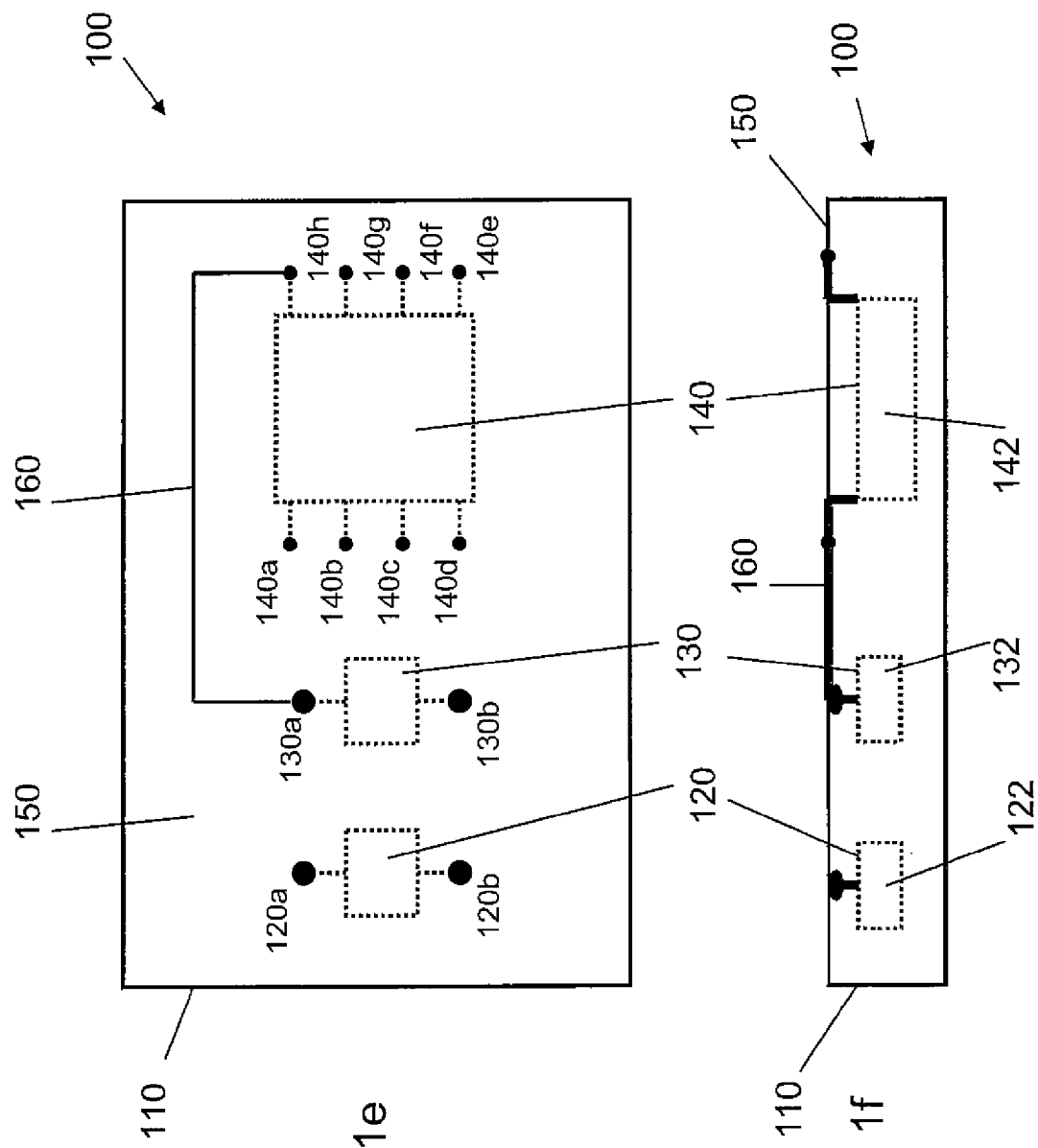

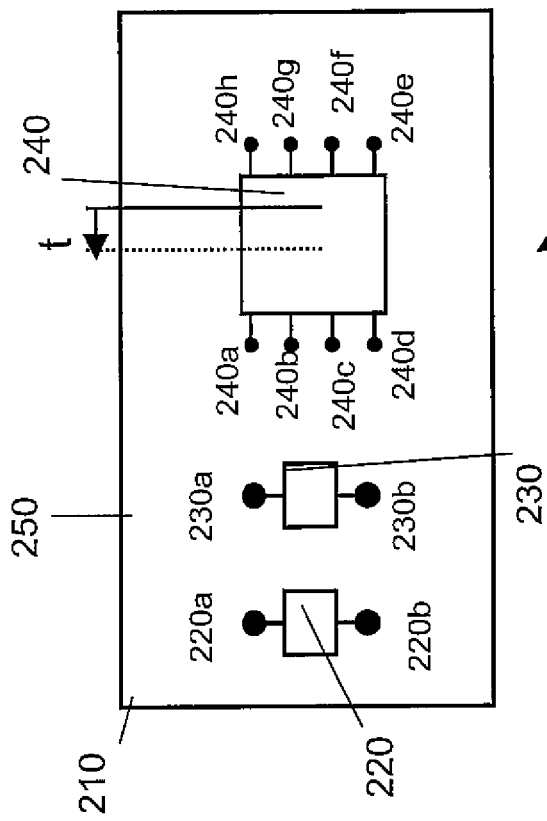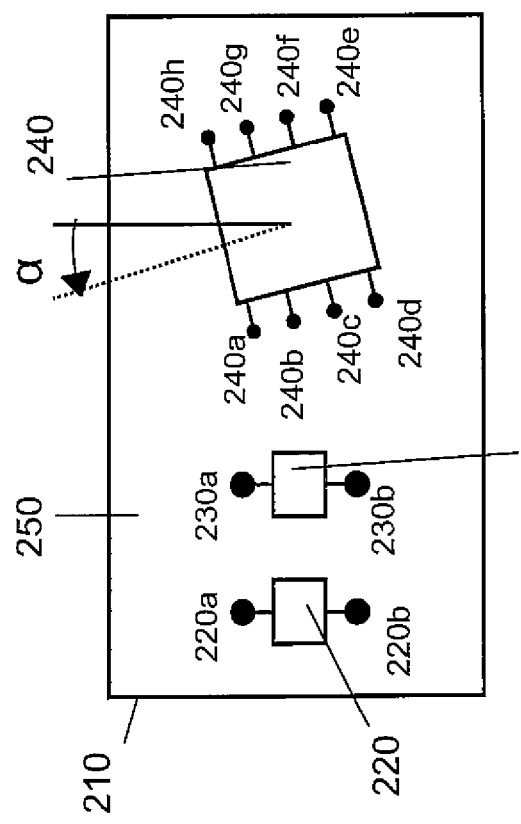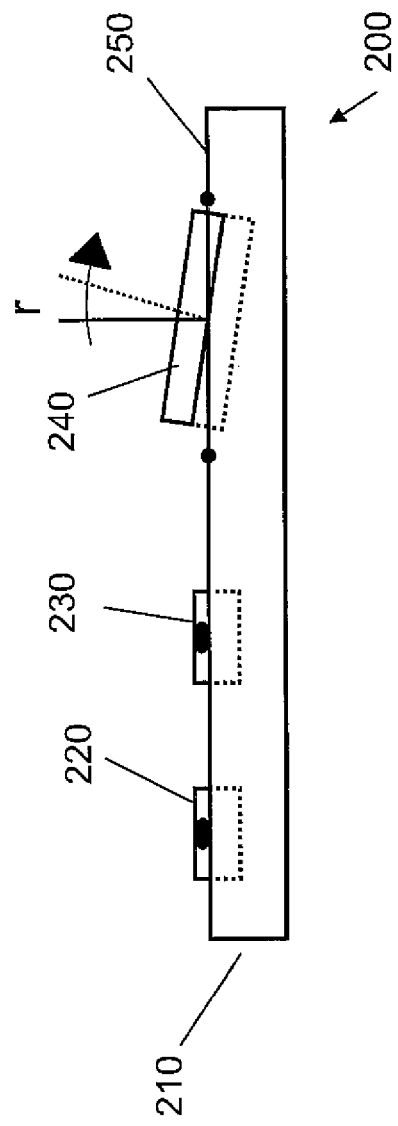

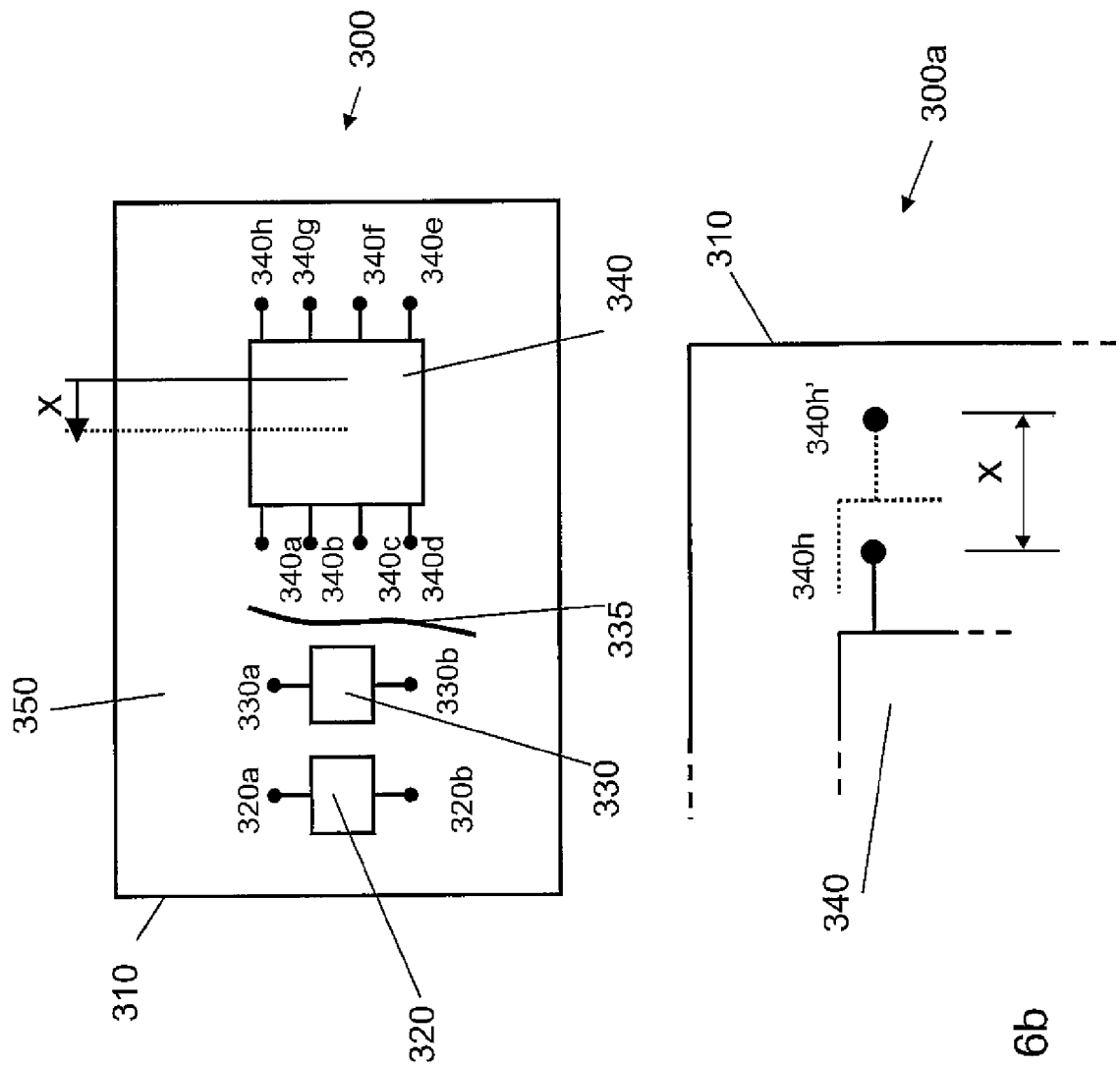

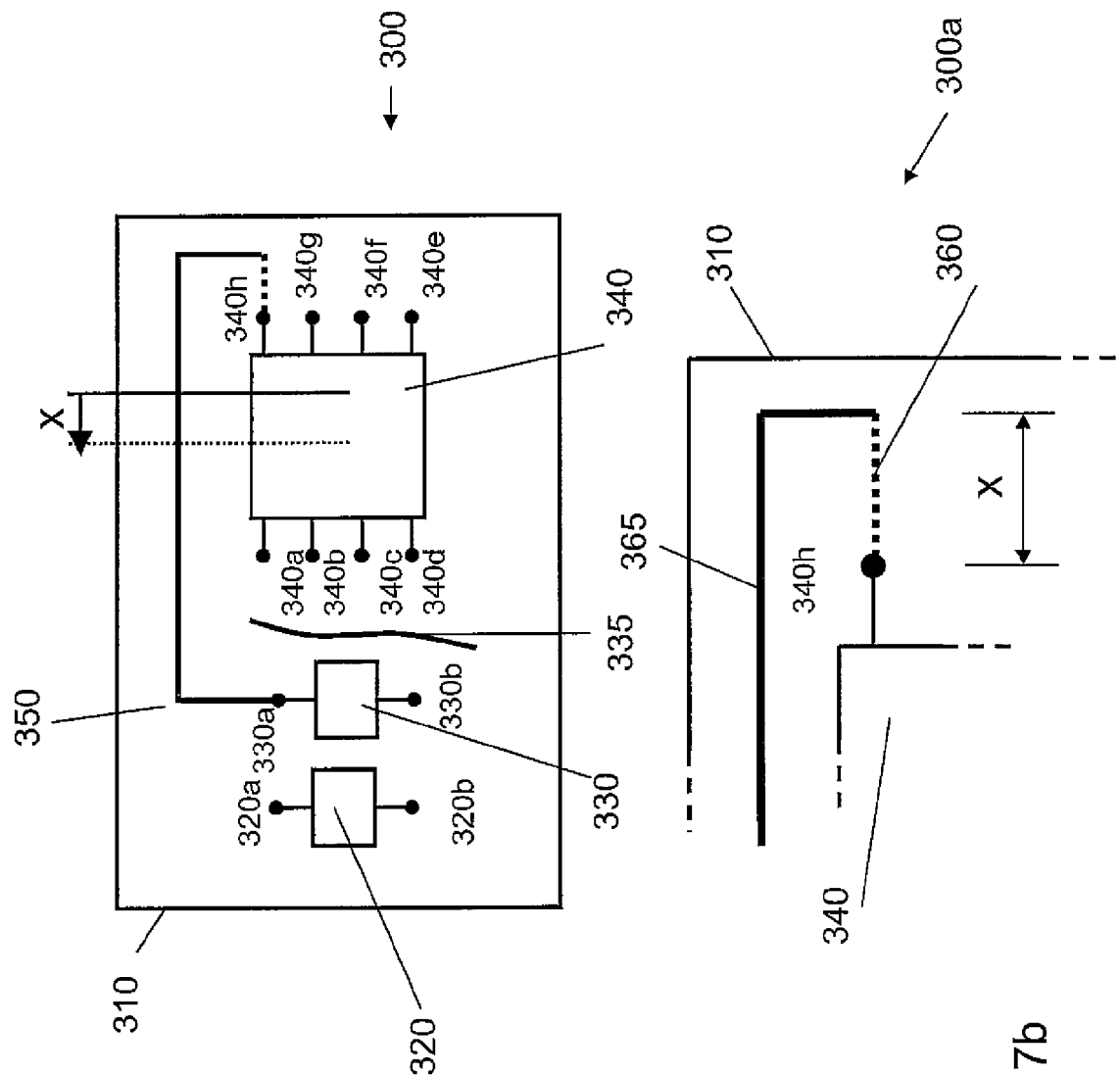

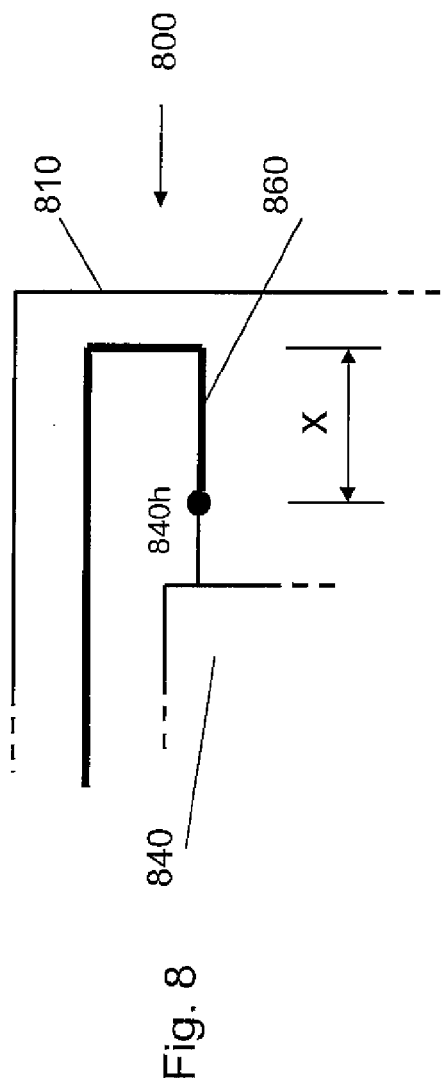
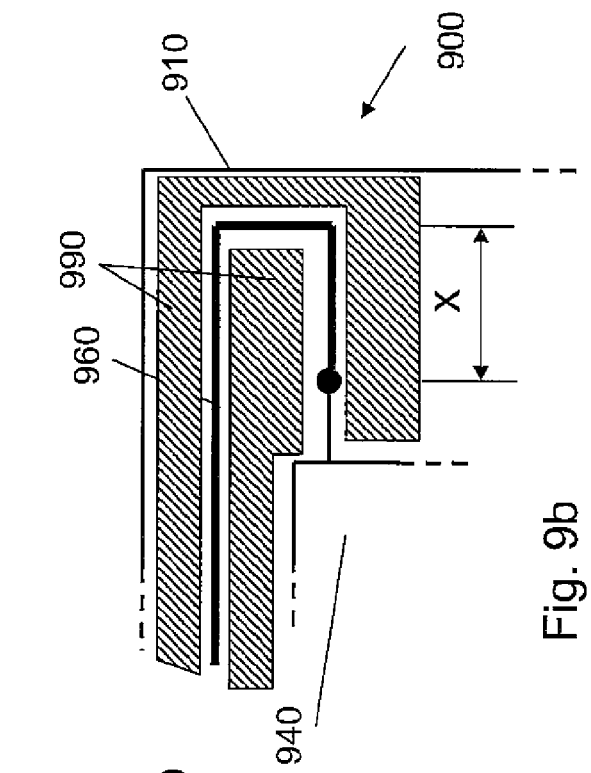
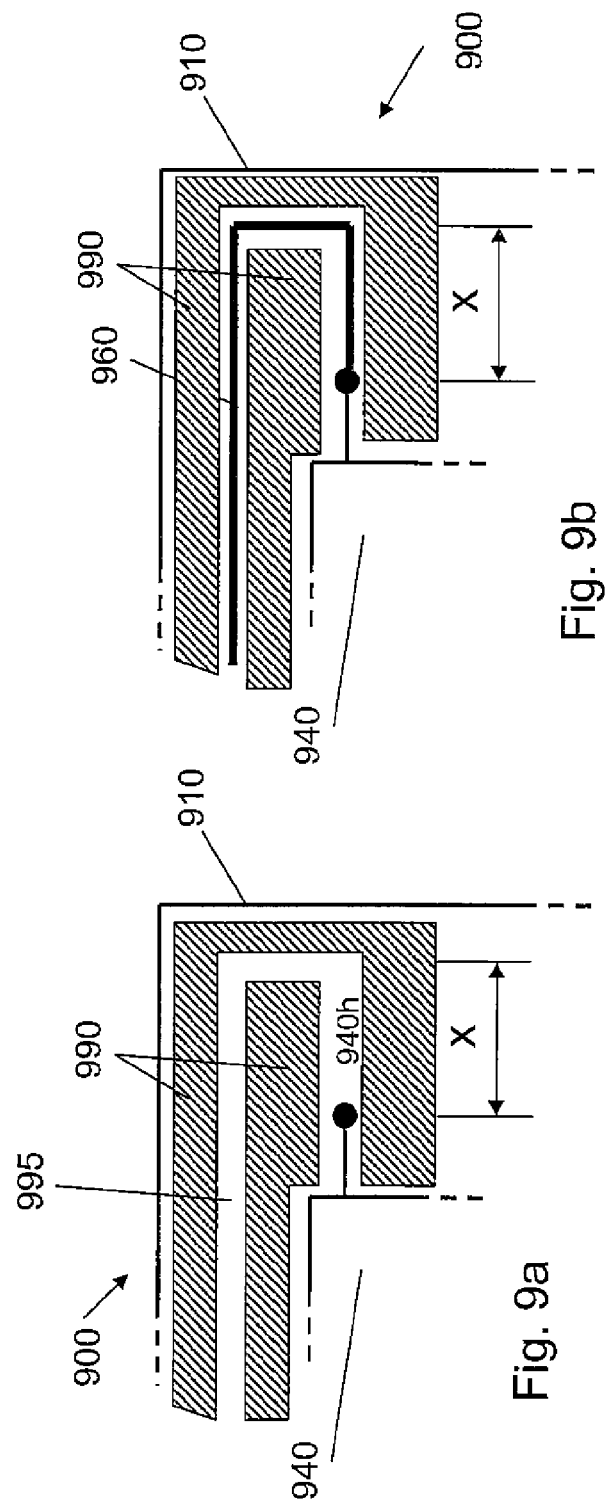

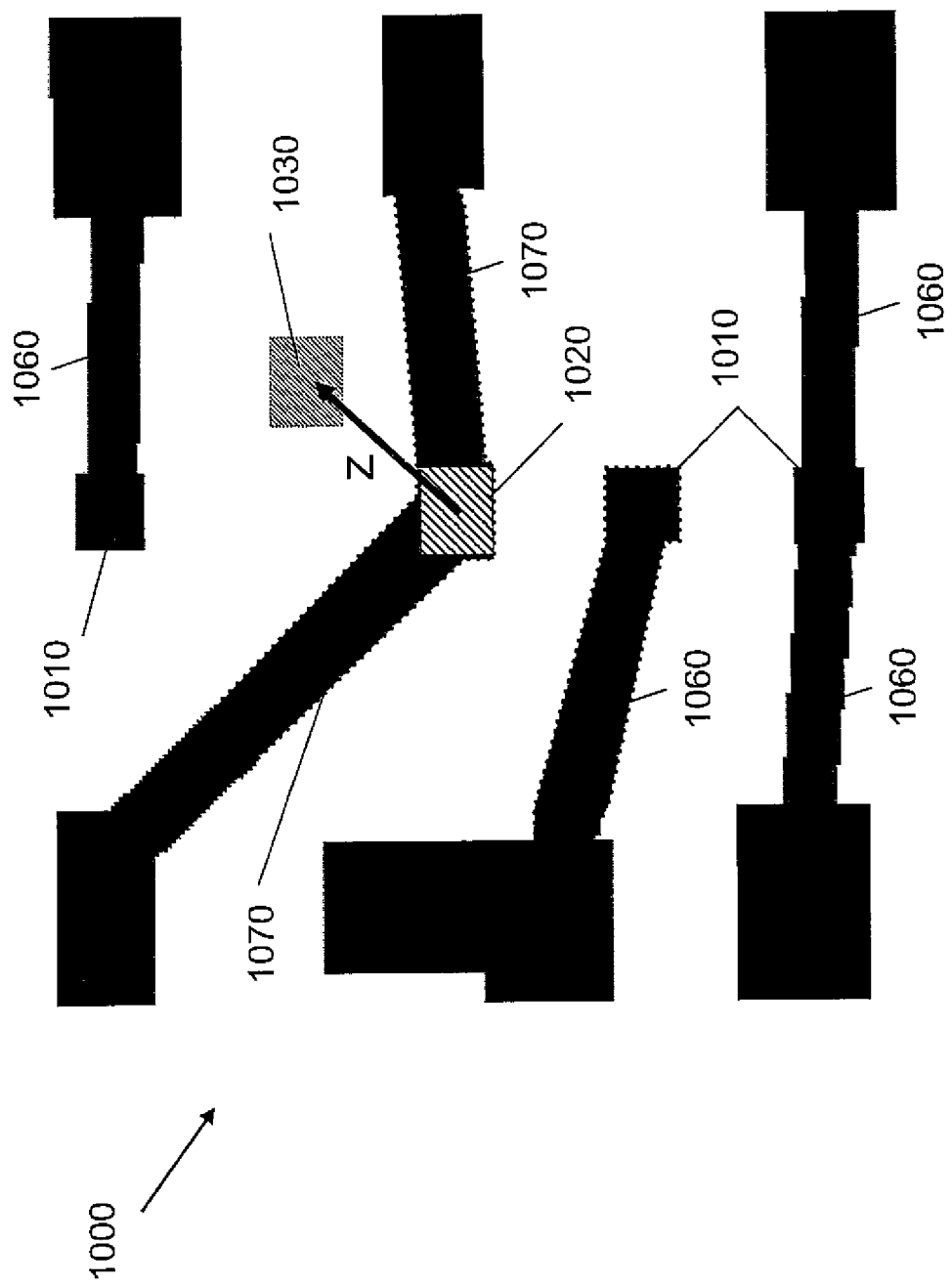

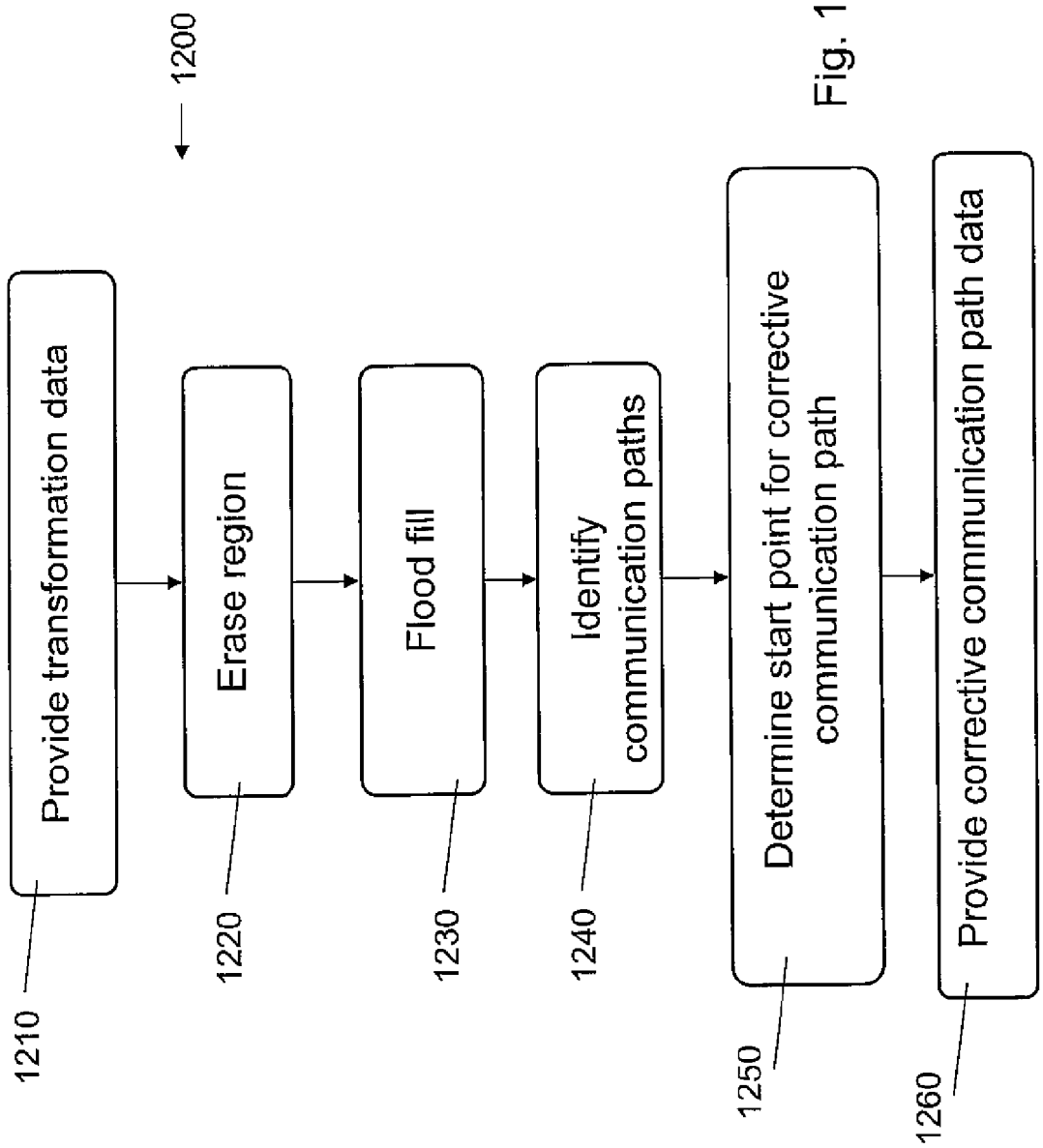

CIRCUIT ARRANGEMENTS AND ASSOCIATED APPARATUS AND METHODS

TECHNICAL FIELD

The present invention relates to the field of circuit arrangements for use in electronic modules, and in particular, but not limited to, a method of manufacture of printed electronic modules/circuit arrangements.

BACKGROUND

Printed electronic modules/circuit arrangements, such as printed circuit boards and the like, are integral in many electronic devices that are manufactured today. Such modules generally comprise a fibre support board, upon or in which conductive paths, or routes, are provided to connect electrically one component to another; said components being mechanically affixed to the board. Such boards have been in use for a number of years.

As the performance requirements of electronic devices increases, there is an ever increasing demand to provide printed electronic modules that can accommodate more, and smaller, components. Due to the reduction in size of the components used and the increase in their population per unit area there is a requirement for the manufacturing process and the manufacturing equipment, or so-called tooling, used in the manufacturing of such boards to be able to position components, and/or conductive paths, with increasing accuracy. Failure to be able to do so results in a poor and commercially unfavourable yield of functional modules. Such failures can arise due to the lack of desired electrical continuity between components on the board.

In order to provide accurately located components or conductive paths, the cost of tooling means that the manufacture cost of the final module in some circumstances in prohibitively high. There is a requirement therefore to provide a method of manufacture of such printed electronic modules, which can satisfy the ever increasing requirements of miniaturisation, without requiring complex and expensive manufacturing equipment and processes.

The listing or discussion of a prior-published document or any background in this specification should not necessarily be taken as an acknowledgement that the document or background is part of the state of the art or is common general knowledge. One or more aspects/embodiments of the present invention may or may not address one or more of the background issues.

SUMMARY

In a first aspect, there is provided a method comprising:
examining the location of one or more feature(s) of the one or more component(s) of a circuit arrangement to determine the displacement of the location of said one or more associated communication contact(s) with respect to a designed location for the communication contact(s),
and providing corrective communication path layout data of said circuit arrangement based upon the said displacement(s).

There is also provided a method for providing corrective communication path layout data of a circuit arrangement, the circuit arrangement comprising one or more component(s), secured to a support, and associated one or more communication contact(s), to allow for communicative connection of the respective component, the method comprising:

examining the location of one or more feature(s) of the one or more component(s) to determine the displacement of the location of said one or more associated communication contact(s) with respect to a designed location for the communication contact(s),
and providing corrective communication path layout data based upon the said displacement(s).

The corrective communication path layout data may be used to provide corrective communication paths between the location of the one or more communication contacts and the designed location for the communication contact(s) to correct for the said displacement.

The corrective communication path may be conductive, semi-conductive, optical, or the like. The corrective communication path may be provided by an electrically conductive material, or an optically conductive material, such as a wave guide (e.g. optical fibre), or the like. A portion or all of the corrective communication path may form a component, such as a resistor, capacitor, semi-conductive device, antenna, or the like.

The corrective communication path layout data may be used to provide corrective insulating paths between the location of the one or more communication contacts and the designed location for the communication contact(s) to correct for the said displacement.

Alternatively or additionally the corrective insulating paths may be arranged so as to provide path wells between the location of the one or more communication contacts and the designed location for the communication contact(s). In such an arrangement the path wells may be subsequently filled with conductive paths or optical paths or the like to correct for the said displacement.

Alternatively or additionally the corrective insulating paths may be arranged so as to provide removable regions, said removable regions being arranged to be removed to provide path wells between the location of the one or more communication contacts and the designed location for the communication contact(s) subsequent to their provision. For example, the corrective insulating paths may comprise wax, or the like, arranged to be removed at a later point in production of a circuit arrangement to provide path wells.

The corrective communication path layout data may be used to provide corrective photomask, or maskset data.

The corrective conductive path layout data may be data for providing 2D path layout, or 3D path layout, or a combination of both.

The components may be electrical, semi-conductive, optical components, insulating, or the like, or any combination thereof.

The corrective communication path layout data may be used to provide a combination of any two or more of corrective conductive paths, corrective semi-conductive paths, corrective optical paths, corrective insulating paths, corrective photomask, or maskset data.

Such a method may allow for any misalignment of a component to be corrected without the requirement for relatively expensive tooling and/or processing to ensure that the components are placed within particular tolerances when manufacturing the circuit arrangement. In addition subsequent components that form a portion or all of the corrective communication path (e.g. resistors, antennas, etc.) may be provided that compensate for any misalignment of another component.

Connection of the respective component may be to another circuit arrangement. Connection of the respective component may be to another component of the same and/or different circuit arrangement.

The step of examining may include using an image of the circuit arrangement, or a portion thereof to determine the displacement. The image may be a photographic image, an X-ray image, or the like. The image may be obtained by acoustically imaging the circuit arrangement, or portion thereof, such as by coupling an imaging wave with the support. The image may be a digital image, or analogue image. The image may be obtained from an image sensor. Using an image sensor may allow for a visual image to be obtained and converted to a digital image.

The image may be a two-dimensional image, or may be a three-dimensional image. Providing a three dimensional image may allow for further detail in relation to the displacement to be examined.

The step of examining may comprise: discriminating between the one or more components and the support in the image to identify the one or more components; and identifying one or more feature(s) of the one or more identified components to determine the displacement.

The step of discriminating and/or identifying the feature may include comparing a characteristic of a portion of the image with a characteristic of a different portion of the image. The characteristic may be the colour. The characteristic may be the contrast. Such an arrangement may allow for a darker area to be compared with a lighter area in the image.

The one or more feature(s) may be the one or more communication contact(s) of the component(s). The feature may be a feature of the component(s), which by association is related to the one or more contact(s), such as an orientation dimple, an edge region of the component(s), or the like.

The step of examining may comprise classifying the identified features to use in further feature examination. The classification of features may be used to classify the examined features into features and non-features.

Such an arrangement may allow for a relatively coarse assessment to be initially made, followed by a relatively refined assessment of the location of a feature after classification, which may reduce processing requirements when compared to providing a relatively refined assessment, i.e. classification, on the entire image.

The classification may be achieved using neural network technology. Such an arrangement would allow for the classification to be learned and improved by exposing the neural network to prior examples of features and non-features. The classification may be achieved by an alternative arrangement.

Examining may comprise observing at least of one of the translation, the scaling, the rotation and the shearing of the feature to determine the displacement of the location of said one or more communication contacts with respect to the designed location for the one or more communication contacts.

Examining may further comprise providing transformation data based upon at least one of the following: the translation, the scaling, the rotation and the shearing of the feature.

When using the one or more communication contacts as features, the transformation data may be provided by pairing examined communication contact locations with designed locations. Such pairing may allow for the cardinalities of the examined communication contact locations with designed locations to be substantially the same. Such pairing may reduce false identification of features.

The transformation data may be used to modify the designed communication path layout data. The designed communication path layout data may be modified using a corrective algorithm to provide the corrective conductive path layout data.

The corrective algorithm may erase a portion of the designed communication path layout data. The corrective algorithm may use a processor and a memory to erase a portion of the designed communication path layout data. The corrective algorithm may additionally or alternatively provide a corrective portion for the designed communication path layout data. Both may provide the corrective conductive path layout data.

The corrective algorithm may use an erasing radius around a particular contact to erase a portion of the designed communication path layout data, and a correction radius around the particular contact to provide the corrective portion respectively.

The step of providing the corrective communication path may comprise providing a portion of the designed corrective path layout, which may be the entire designed corrective path layout.

The providing of the corrective communication path between the location of the one or more communication contacts and the designed location for the communication contact(s) to correct for said displacement may be achieved by the omission of a portion of the designed communication path layout.

The step of providing the corrective communication path may use the transformation data to update designed communication path layout data. The transformation data may be weighed. The weighing may be such that corrective communication paths and/or the corrective insulating paths in a critical area are modified less than the communication/insulating paths in a less critical area.

In some arrangements, the method may comprise indicating that the circuit arrangement, or a portion of the circuit arrangement, is to be rejected if the displacement of the location of said one or more communication contacts with respect to a designed location for the communication contact(s) is outside a particular threshold. The circuit arrangement, or a portion of the circuit arrangement, may be rejected if the transformation data exceeds a certain threshold. Such provisions would help maintain the quality control of the circuit arrangement.

The corrective communication/insulating path may be provided by printing, such as by inkjet printing. The corrective communication/insulating path may be printed using fluids for creating structures, or fluids containing catalytic particles used when growing structures.

The corrective communication path may be printed using fluids containing catalytic particles used when growing conductive structures with an electroless plating process, or the like.

The corrective communication path may be printed using nanoink. The corrective conductive path may be provided on a surface region of the support.

The corrective insulating path may be provided in two stages. A first stage may apply a layer of insulating, or dielectric material. The insulating, or dielectric material may define the path-wells. The insulating, or dielectric material may be printed. In a second step the path wells may be filed with a communicative material, such as conductive fluid, which may be nanoink or the like. The communicative material may be arranged to electrically or optically connect components.

The corrective communication/insulating path may be provided between respective layers of the support. In such an arrangement, the support may be provided with a plurality of layers. Each layer may have designed communication path layout data associated therewith. The same transformation data may be used to update each layer's designed communication path layout data. Alternatively new transformation data may be used to update each layer's designed communication path layout data.

The support may be a mould. The components may be partially, or substantially embedded in the mould. In such an arrangement, the one or more electrical contact may be exposed on a surface region of the support. The components may be entirely embedded within the support. The support may be provided with communication channel(s) that extend from the communication contacts of the components to the surface of the support. In such an arrangement the identified feature may be communication channels, or a portion thereof.

The mould may be a resin, such as a synthetic resin, which may be substantially insulating. In such an arrangement, the components, during fabrication, may be roughly placed in a wet mould, said wet mould then allowed to harden, such as by curing.

The method may further comprise the additional preliminary step of providing the circuit arrangement and securing the one or more components to the support. The method may comprise the additional preliminary step of providing the circuit arrangement and substantially embedding the one or more components in a mould support.

There is also provided a method for manufacturing a circuit arrangement according to the first aspect. The method may comprising using the corrective communication path layout data in manufacturing the circuit arrangement.

According to a second aspect of the present invention there is provided an apparatus comprising:
  an input arranged to receive data relating to an examined location of a feature of the one or more component(s) of a circuit arrangement, said feature relating to the displacement of the location of one or more associated communication contact(s) in relation to a designed location for the communication contact(s); and
  one or more processor(s) arranged to evaluate the displacement(s) and provide corrective communication path layout data of said circuit arrangement accordingly.

There is also provided an apparatus for providing corrective communication path layout data of a circuit arrangement, the circuit arrangement comprising one or more component(s), secured to a support, and associated one or more communication contact(s) to allow for communicative connection of the respective component, the apparatus comprising:
  an input arranged to receive data relating to an examined location of a feature of the one or more component(s), said feature relating to the displacement of the location of one or more associated communication contact(s) in relation to a designed location for the communication contact(s); and
  one or more processor(s) arranged to evaluate the displacement(s) and provide corrective communication path layout data accordingly.

The apparatus may additionally comprise a communication path provider arranged to provide a corrective communication path between the location of one or more contacts on a circuit arrangement and a designed location of the one or more contacts based upon said corrective communication path layout data.

Alternatively the communication path provider may be arranged to provide a corrective insulating path between the location of one or more contacts on a circuit arrangement and a designed location of the one or more contacts based upon said corrective communication path layout data.

The corrective communication path layout data may be used to provide corrective insulating paths between the location of the one or more communication contacts and the designed location for the communication contact(s) to correct for the said displacement.

Alternatively or additionally the corrective insulating paths may be arranged so as to provide path wells between the location of the one or more communication contacts and the designed location for the communication contact(s). In such an arrangement the path wells may be subsequently filled with conductive paths or optical paths or the like to correct for the said displacement.

The communication path provider may be a printer, such as an inkjet printer. The communication path provider may be arranged to print with conductive ink, such as nanoink. Alternatively the communication path provider may be an etching apparatus, lithography apparatus, or the like.

The communication path provider may be arranged to provide wave guide material, semi-conductor material or the like.

The communication path provider may be arranged to provide additionally a portion of the designed communication path layout, which may be the entire designed communication path layout.

The communication path provider may be arranged to provide an insulating material, and/or dielectric material. In addition the communication path provider may be arranged to provide a communication path, such as a conductive path. In such an arrangement the communication path provider may be arranged to provide insulting and/or dielectric material to a circuit arrangement so as to produce path wells. The communication path provider may then be arranged to provide a communication path substantially in those path wells. This may communicatively connect respective components.

In a third aspect, there is provided a computer program comprising computer code arranged to control an apparatus according to the second aspect to provide corrected communication path layout data for a circuit arrangement.

In a fourth aspect, there is provided a means comprising:
  means for input to receive data relating to an examined location of a feature of the one or more component(s) of a circuit arrangement, said feature relating to the displacement of the location of one or more associated communication contact(s) in relation to a designed location for the contact(s); and
  means for processing to provide corrective conductive path layout data of said circuit arrangement based upon the data relating to the examined location of the feature accordingly.

There is also provided a means for providing correcting conductive path layout data of a circuit arrangement, the circuit arrangement comprising one or more component(s), secured to a support, and associated one or more communication contact(s) to allow for communicative connection of the respective component, the means comprising:
  means for receiving data relating to an examined location of a feature of the one or more component(s), said feature relating to the displacement of the location of one or more associated communication contact(s) in relation to a designed location for the contact(s); and
  means for processing to provide corrective conductive path layout data based upon the data relating to the examined location of the feature accordingly.

In a fifth aspect, there is provided a method for providing corrective communication path layout data of a circuit arrangement, the circuit arrangement comprising one or more component(s), secured to a support, and associated one or more communication contact(s), to allow for communicative connection of the respective component, the method comprising: examining the location of one or more feature(s) of the one or more component(s) to determine the displacement of the location of said one or more associated communication contact(s) with respect to a designed location for the communication contact(s), in which the one or more feature(s) are the one or more communication contact(s) of the component(s), and wherein the examining comprises: discriminating between the one or more components and the support in an image to identify the one or more components; and identifying one or more feature(s) of the one or more identified components to determine the displacement; and providing corrective communication path layout data based upon the said displacement(s).

The present invention includes one or more corresponding aspects, embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:

FIGS. 1a and 1b show a plan view and an end view of an electronic circuit arrangement/module in which components are partially embedded, FIGS. 1c and 1d show a plan view and an end view of an electronic circuit arrangement/module in which components are substantially embedded and FIGS. 1e and 1f show a plan view and an end view of an electronic circuit arrangement/module in which components are fully embedded for background understanding;

FIGS. 2a, 2b, and 2c show various displacements of components on a module;

FIG. 6a shows a module in which a component has translated and FIG. 6b shows an enlarged region of a portion thereof;

FIG. 7a shows a module of FIG. 6 in which a corrective communication path has been provided, and FIG. 7b shows an enlarged region of a portion thereof;

FIG. 8 show an enlarged region of a portion of a module comprising optical corrective communication path;

FIG. 9a show an enlarged region of a portion of a module comprising corrective insulating path and FIG. 9b shows the portion of the module additionally comprising a conductive path;

FIG. 11 shows a flow diagram of the steps taken in correcting the designed communication path layout data of FIG. 10.

DESCRIPTION OF SPECIFIC EMBODIMENTS

Figure 3:
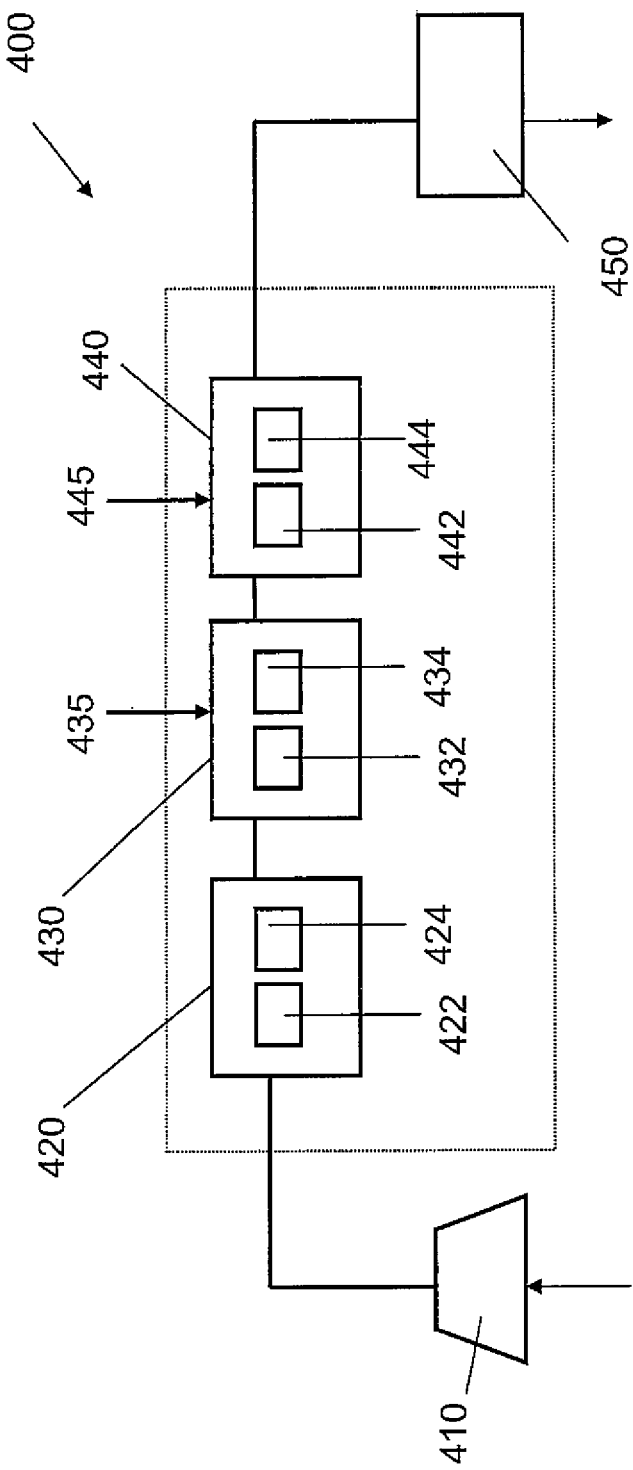
FIG. 3 shows an apparatus for correcting a communication path.

FIG. 1a shows a plan view of a circuit arrangement 100 for background understanding. Here the circuit arrangement 100 is arranged as an electronic module 100. FIG. 1b shows an end view of the module 100 shown FIG. 1a.

The module 100 comprises a support 110 and, as shown here, three electrical components 120, 130, 140. Two of the components 120, 130 are surface mount components, such as surface mount resisters, capacitor, or the like. Each are associated in a known manner with two contacts 120a, 120b, 130a, 130b respectively.

For clarity the third component 140 is shown as a dual in-line package (DIP), which comprises a plurality of contacts 140a-140h. In the module 100 shown, the third component 140 comprises eight contacts 140a-140h. In alternative embodiments the skilled reader will readily appreciate that the third component may be provided by a flip-chip (e.g. BGA), or may be a bare die, or the like.

The components 120, 130, 140 are arranged such that an embedded portion 122, 132, 142 thereof is embedded within the support 110. The support 110 is arranged to mechanically secure to components 120, 130, 140 to the support 110. Here the support 110 is provided by resin, such as an epoxy resin, polyimide resin, or the like. In alternative configurations the support 110 may be provided by a substantially flexible material, such as a plastic or the like.

The components 120, 130, 140 are arranged on the support 110 such that their respective contacts 120a, 120b, 130a, 130b, 140a-140h remain exposed at a surface region 150 of the support 110.

The module 100 further comprises a communication path 160. The communication path 160 is provided on the surface region 150 of the support 110 and arranged to connect communicatively a contact 130a of the second component 130 to a contact 140h of the third component 140.

As in the present embodiment the module 100 is an electronic module 100, the contacts 120a, 120b, 130a, 130b, 140a-140h are electrical contacts and the communicative path 160 is an electrically conductive path. A person skilled the art will readily be able to appreciate a similar arrangement for an optical module or the like.

The communication path 160 is provided by a conductive material, such as a conductive nanoink, which may be a silver based nanoink. As a skilled person will readily appreciate, in alternative arrangement the communication path may be semi-conductive, dielectric, optical, insulating, etc.

During manufacture, the components 120, 130, 140 are first secured to the support 110, when the support is in a liquid form. The support 110 is then allowed to substantially harden, which may be by curing. Subsequently, the communication path 160 is printed between the relevant contacts 130a, 140h on the surface region 150.

It will be readily appreciated that the number and type of components/communication paths used here are exemplary only. Alternative modules 100 may comprise any number of components, which may include 1, 2, 5, 10, 50, 100, 1000, 10000, 50000 or any number therebetween Additionally, the components may be inductors, transistors, potentiometers, or the like, as well as other integrated circuits, such as Programmable Intelligent Computers (PICs), Field Programmable Gate Arrays (FPGAs), memory modules such as Random Access Memory (RAM) modules, or the like. Such components may be DIP, or Thin Quad Flat Pack (TQFP) or the like. Additionally the other components may be other elements such as Micro-Electro-Mechanical-Systems (MEMS), antennas, energy sources, keypads, displays, etc. Similarly, the components may be a mixture of electric/optical/semi-conductive/dielectric/insulating, or the like. The communication path(s) may be arranged specifically for whichever components are to be connected, (e.g. conductive/optical, or combination thereof).

While, as shown here, the components are surface mount, in alternative arrangements the contacts 120a, 120b, 130a, 130b, 140a-140h may comprise pins, or balls, or the like.

In addition, it will be readily appreciated by the skilled reader that modules 100 may comprises any number of communication paths 160, each of which may be arranged to connect between various contacts, which may be on that particular module 100, or be arranged to connect to other modules/external devices and the like. The communication paths may include a ground plane.

FIGS. 1c and 1d show the module 100 in a similar arrangement as above, however the embedded portions 122, 132, 142 of the components 120, 130, 140 are arranged such that they are substantially embedded within the support 110. FIGS. 1e and 1f show the module 100 in which the embedded portions 122, 132, 142 of the components 120, 130, 140 are entirely embedded within the support 110. It will be readily appreciated that in the latter arrangement, there are associated through paths to the contacts.

FIG. 2a shows a plan view of a module 200, similar to that described above comprising a support 200 with a surface region 250, components, 220, 230, 240, and associated contacts 220a, 220b, 230a, 230b, 240a-240h in which during, or subsequent to, manufacture the third component 240 has been rotated through an angle 'α' parallel to a plane of surface region 250 of the support 210.

FIG. 2b shows a plan view of the module 200 in which during, or subsequent to, manufacture the third component 240 has been translated by a distance 't' parallel to surface region 250 of the support 210.

FIG. 2c shows an end view of the module 200 in which during, or subsequent to, manufacture the third component 240 has been rotated about an angle 'r' in a plane orthogonal to the surface region 250 of the support 210.

It will be readily appreciated that the above displacements are given an examples only, and that any combination thereof may arise during, or subsequent to manufacture, e.g. rotation and translation. Additionally components, or portions thereof, may be scaled when compared to a designed, or desired, location during, or subsequent to, manufacture. Such an arrangement may occur if a portion, which may be all of a component, is stretched or contracted or the like. Similarly, the components may be sheared (i.e. skewed, transvected), or may appear sheared when viewed from a particular angle.

Such displacements, similar to those described above, may cause movement of contacts associated with a component 220, 230, 240 from a designed location to a new location (as this is a deviation from the expected location/arrangement of FIG. 1). In such an arrangement, subsequently printed communication paths may not connect to all the desired contacts. In these instances, the module 200 will fail to function as designed. Such displacements may be due to cracking, swelling, ablation, which may be thermal, undesired bubble formation in the support 210, or the like. Additionally, poor locating of the components 220, 230, 240 on the support 210, or substandard resin, or the like may contribute to such displacement of components 220, 230, 240 from a designed location.

FIG. 3 shows an apparatus 400 for providing corrective a communication path layout data according to a present embodiment. The apparatus 400 comprises a front-end 420, a back-end 430, and a path-corrector 440. The apparatus 400 is further connected to an imager 410 and a printer 450.

The imager 410 is provided by an image sensor, which is arranged to obtain a visual image and convert this to a digital image. The imager 410 is arranged to acquire a two-dimensional image of a surface region 150, 250 of a module 100, 200. In other embodiments the imager 410 may be arranged to capture an image by way of photograph, X-ray, acoustic coupling, etc. or the like. Similarly the imager 410 may be arranged to provide a three-dimensional image, which may be of the support 110, 210, or a portion thereof. In such an arrangement, the imager 410 may comprises more than one image sensor, camera, or X-ray, or the like. A person skilled in the art will readily be able to implement such alternative embodiments.

In the present embodiment, the imager 410 is arranged to export the acquired image, which in the present embodiment is a bitmap image, to the front-end 420 of the apparatus 400. The imager 410 is arranged such that the image acquired, and exported, has a resolution such that a particular feature on the surface region 150, 250 or on a component 120, 220, 130, 230, 140, 240 is discernable in the acquired image, said feature being associated with the location of the contacts of a particular component. In the present embodiment, the imager 410 is arranged such that the contacts of the components are discernable in the image, as will be described in further detail below.

In other embodiments, the feature may be an edge region of a component, or a particular marking on the support or on the component, such as a painted mark on a support or an orientation dimple on an IC package, or the like. A person skilled in the art will readily be able to implement such other embodiments accordingly.

The front-end 420 comprises a front-end processor 422 and front-end memory 424, arranged in a known manner to operate on the image provided by the imager 410. The front-end 422 is further arranged so as to provide an artificial neural network (ANN), as will be described herein. In the present embodiment, the ANN is provided by software executed by the front-end processor 422 and front-end memory 424. However in alternative embodiments the ANN may be provided by hardware, firmware or the like. In the present embodiment, the front-end 420 is arranged to detect the location of the particular feature, or features in the case of the contacts, or the like, and output data relating to this or these locations to the back-end 430. It will be appreciated that in other embodiments, other feature classification methods may be used.

The back-end 430 comprises a back-end processor 432 and a back-end memory 434, which in some embodiments may be the same processor and memory as the front-end processor 422 and front-end memory 424. The back-end 430 is arranged to receive data relating to the location of the particular feature(s) from the front end 420.

The back-end 430 is additionally arranged to receive data relating to the designed location of the particular features(s), or so-called design data 435. The back-end 430 is arranged to output data relating the displacement of the location(s) of the particular feature(s) in relation to the designed locations, i.e. output so-called transformation data. The transformation data in the present embodiment may comprise translation, rotation, shearing, or scaling data, or any combination thereof.

The path-corrector 440 comprises a corrector processor 442 and a corrector memory 444, which in some embodiment may be the same processor and memory as the front-end 420 and/or the back-end 430. The path-corrector 440 is arranged to receive the transformation data from the back-end 430. The path-corrector 440 is additionally arranged to receive data relating to the designed location of the communication paths for the module of the particular image, or so-called designed communication path layout data 445.

The path-corrector 440 is arranged to output corrective communication path layout data in relation to the so-called transformation data. In this embodiment the corrective communication path layout data relates to corrective communication paths, which are conductive paths. However it will readily be appreciated that corrective communication path layout data relates to corrective insulating paths, or the provision of so-called path wells (wells formed between corrective insulating paths arranged to be subsequently filed), or the like.

The printer 450 is an inkjet printer. The printer 450 is arranged to print conductive nanoink in a known manner. The printer 450 is arranged to receive the data relating to the corrective communication paths from the back-end 440 and print said corrective communication paths on a surface region 150, 250 of a module 100, 200 accordingly.

Figure 4:
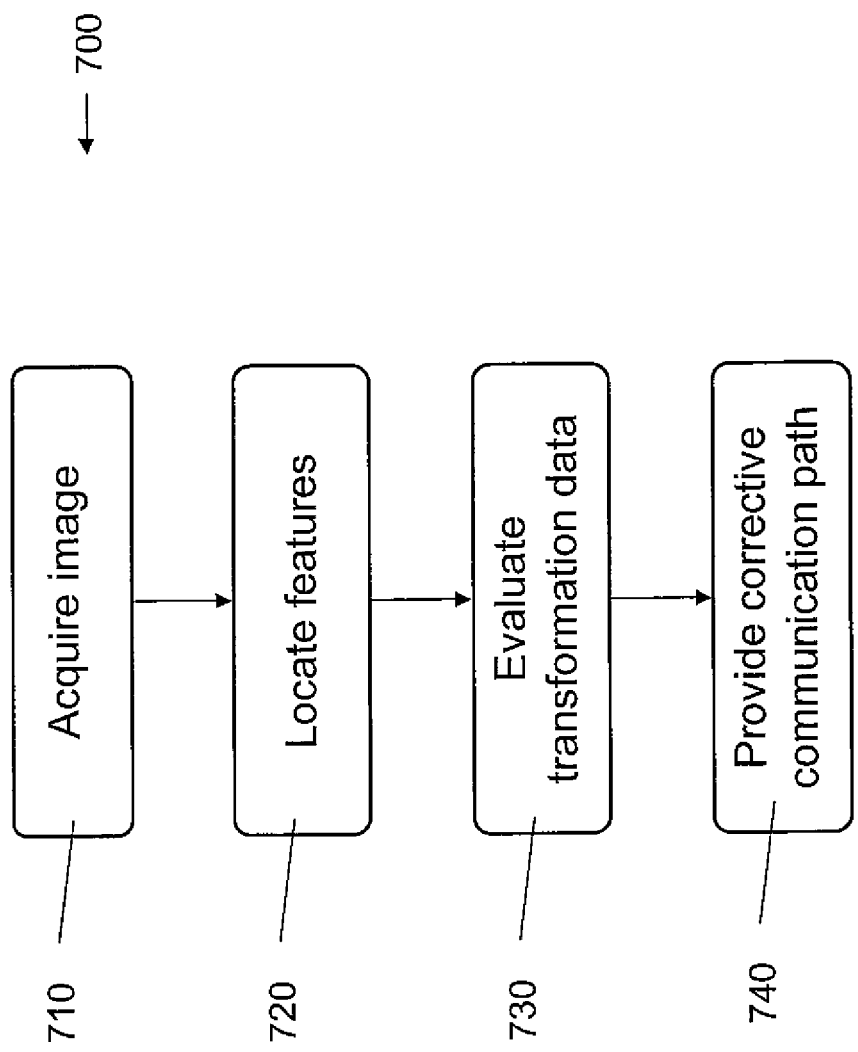
FIG. 4 shows a flow diagram of the steps taken in correcting a communication path, using the apparatus of FIG. 3.

FIG. 4 shows a flow diagram 700 of the apparatus 400 in use. In a first step 710, an image is acquired by the imager 410 of a module 300, said module 300 shown in FIG. 6a. In a second step 720 a particular feature or features within the image are identified by the front-end 420, said features being associated with one or more communication contacts of an imaged component. In a third step 730 the location of the features are established and compared with the designed location of those feature(s), so as to provide transformation data. The transformation data is indicative of the displacement of the location of one or more associated communication contact(s) with respect to the designed location for the communication contact(s). In a fourth step 730, a corrective communication path is provided between the location of the one or more communication contact(s) and the designed location for the communication contact(s) to correct for said displacement. Such provision is achieved by using the transformation data. In this embodiment the corrective communication path is provided by modifying the designed communication path layout based on the transformation data.

Figure 5:
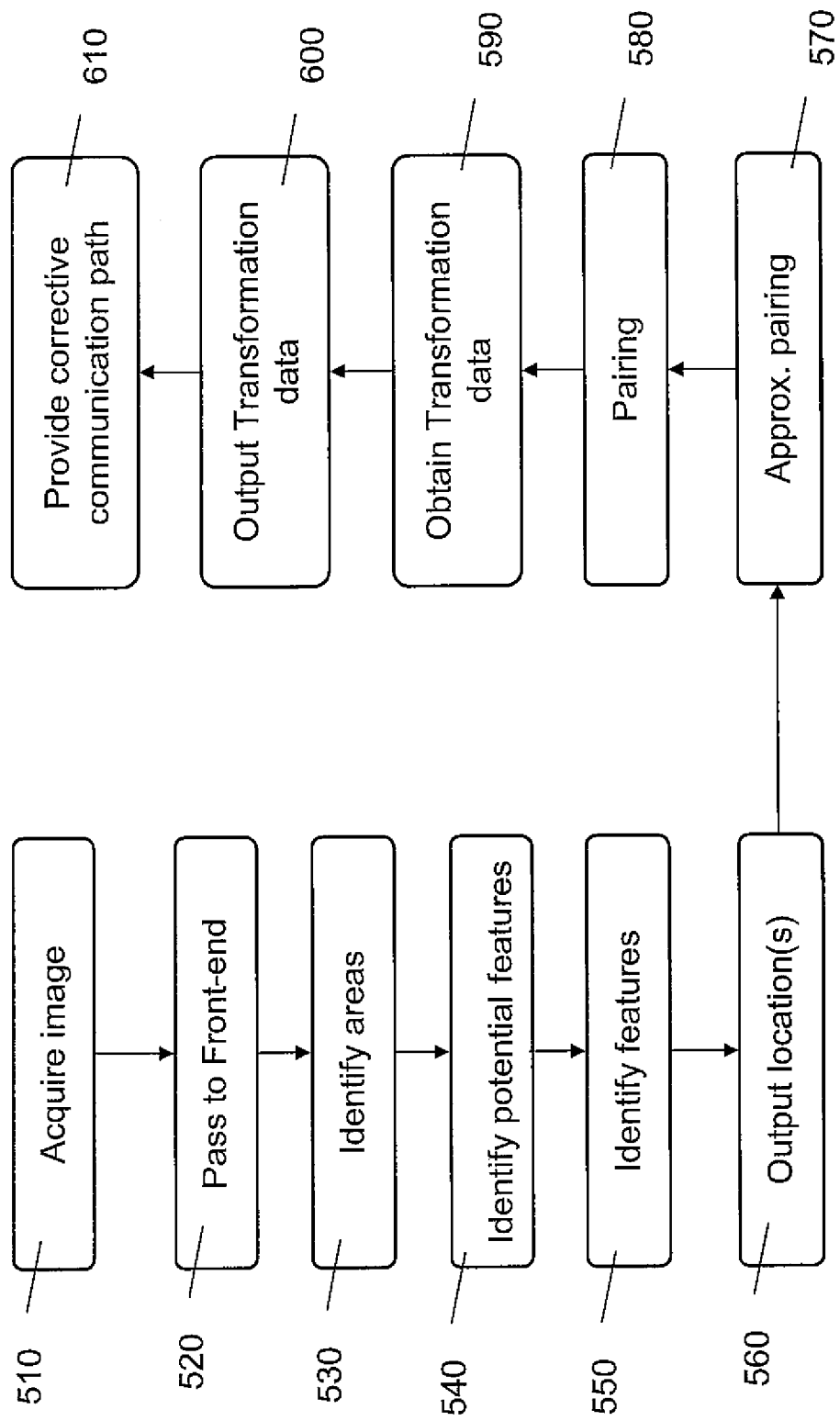
FIG. 5 shows a detailed flow diagram of the steps taken in correcting a communication path, using the apparatus of FIG. 3.

FIG. 5 shows a detailed flow diagram 500 of an embodiment of the apparatus 400 in use. In the following described embodiment, the particular feature is taken to be the location of the communication contacts of the components. However, as described above, other features may be used. Additionally, in alternative embodiments only some of the contacts may be used. A person skilled in the art will readily be able to adapt the following arrangement accordingly.

In a first step 510 the imager 410 acquires an image of a surface region 350 of a module 300. FIG. 6a shows the surface region 350 of the module 300, which comprises three components 320, 330, 340. The surface region 350 comprises a cracked portion 355 such that one component 340 has been translated by a distance 'x' from a designed location. Due to such translation, communication contacts 340a-340h associated with the translated component 340 have been translated also by a distance 'x'. FIG. 6b shows a larger representation of a corner region 300a of the module 300 shown in FIG. 6b.

The image comprises the communication contacts 340a-340h of the translated component 340 as well as the other components 320, 330, and their associated contacts 320a, 320b, 330a, 330b.

In a second step 520, shown in FIG. 4, the image is output to the front-end 410. Thirdly 530 the front-end discriminates the components 320, 330, 340 from the support 300. In the present embodiment, a support 300 of known visual properties, such as colour, is used, and thus the front-end 410 is arranged to distinguish between the support 310 and the components 330, 330, 340. Subsequent steps are performed only on those identified area, each which is distinct from the other. The identified areas therefore comprise an image of a component.

It will readily be appreciated that the third step 530 need not occur, and in alternative embodiments the identified area may be the entire support, or a substantial part thereof. Alternatively a predefined identified area may be used.

In a fourth step 540, the front-end 410 is arranged to attempt to identify the communication contacts 320a, 320b, 330a, 330b, 340a-350h of the components 320, 330, 340. This is achieved by using, for example, a low level logic operation to determine where the communication contacts 320a, 320b, 330a, 330b, 340a-350h might be in those identified areas in the third step 530.

In the present embodiment, this is achieved by identifying portions of the identified areas that are lighter in contrast to others. In alternative embodiments however, this may be achieved by identifying portions of the identified areas that are darker, or another characteristics of the identified areas, such as colour or the like. This step 540 is arranged to provide generally more potential communication contacts that are to be ultimately identified. This step 540 may be considered as a coarse identification. Subsequent steps are preformed only on those potential identified contacts.

The following steps are described in relation to those potential identified contacts from one identify area, namely that comprising the translated component 340. A skilled reader will readily appreciate that a similar process may be adopted for the other components.

In a fifth step 550, the front-end 420 is arranged to classify the potential identified contacts into contacts and non-contacts. This is achieved using the ANN technology of the front-end 420, although a skilled reader will appreciate that any number of alternatives may be used. The ANN has been trained to be able to identify actual contacts from false contacts. A person skilled in the art will readily appreciate the application and implementation of such ANNs. This step 550 may be considered as a refined identification.

In a sixth step 560, the front end 410 is arranged to output the location of the actual contacts 340a-340h of the translated component 340. It will readily be appreciated that the location of the contacts 340a-340h is made in relation to some known region of the image, such as a corner region of the support of the like. In this regard, the location of the contacts 340a-340h are output as Cartesian co-ordinates.

In seventh step 570 the back-end processor 432 is arranged to search for an approximate match, or pairing, between the Cartesian co-ordinates of the locations of the contacts 340a-340h, or so-called first set, and the Cartesian co-ordinates of designed locations 340a'-340h', or so-called second set derived from the design data 435.

It will readily be appreciated that the cardinalities of the two sets (i.e. the number of locations in each set) may differ, due to the output from front-end 420 containing false matches. Therefore the back-end 430 is arranged to find well-matching subsets of both the first and second set.

It will readily be appreciated that the number of locations of contacts, N, in the subsets, depends on the assumed error rate of the front-end 420 and on the number of missing designed locations in the design data. For example, if the design data 435 consists of 300 designed locations and the front-end 420 outputs 400 locations, then N for the purposes of the seventh step 570 should be a number below 300. In the present embodiment the back-end 430 is arranged to try and pair roughly 90% of the locations in the first set and the second set. Considering the example in which 300 designed locations are provided, then the back-end 430 is arranged in the seventh step 570 to pair subsets of 270 locations from both two sets (i.e. to pair 270 locations of contacts to 270 location of designed contacts).

In an eighth step the back-end 430 is arranged to obtain/derive pairs for the full set, or so-called point pairs. That is, now that the back-end 430 has provided an approximate pairing between a portion of the contact locations and the designed locations, in the seventh step 570, it is possible to attempt to pair the remaining contacts by using Euclidean distance as the criterion. In such an arrangement the pairing is no longer random.

This can be represented as a bipartite graph matching problem, where the two location sets form the vertices and the problem is to assign N edges between the two sets of vertices in a known manner.

In a ninth step the back-end 430 is arranged to evaluate the transformation from the contact locations to the design locations. A person skilled in the art will readily appreciate that due to the latter pairing, as described above, such evaluation requires reduced computation than similar evaluation where the contact locations were in a random order.

It will readily be appreciated that the transformation model between points $(x_1,y_1)$ and $(x_2,y_2)$ becomes:

$$\begin{pmatrix} x_2 \\ y_2 \end{pmatrix} = s \cdot \begin{pmatrix} \cos\theta & -\sin\theta \\ \sin\theta & \cos\theta \end{pmatrix} \begin{pmatrix} x_1 \\ y_1 \end{pmatrix} + \begin{pmatrix} t_x \\ t_y \end{pmatrix} + \begin{pmatrix} w_x \\ w_y \end{pmatrix} \quad (1)$$

where $\theta$ is the rotation term, s is the scale, $t_x$ and $t_y$ are the translation terms and $w_x$ and $w_y$ the model residuals. A least squares solution can then be derived in a known manner. It will readily be appreciated that a high residual error indicates that the point pairs are incorrect, or that they relate in a non-linear manner. It will also be readily be appreciated that such non-linear matching should, broadly speaking, not occur (e.g. consider the linear relationship as shown in the translation of the component in FIG. 6.)

The back-end 430 is therefore arranged in a tenth step to output said transformation data for each contact using the transformation model. In the present embodiment, the transformation data indicates that the contacts 340a-340h of the translated component 340 have all been translated by a distance 'x' from their respective design locations 340a'-340h'.

It will readily be appreciated that in other embodiments the transformation data may comprise translation, rotation, shearing, or scaling data, or any combination thereof. Additionally the transformation data may indicate a different transformation operation for different components.

For example, considering the situation in which two components have both moved closer to one another during, or subsequent to, manufacture, the transformation data would comprise transformation information relating to one component (e.g. translate a distance 'x') and transformation data relating to the other component (e.g. translate a distance '-x').

A skilled reader will also readily appreciate that the back-end may be arranged to estimate the transformation data of contacts that, while not detected in the above steps, are related to the contacts detected in some manner, such as the other contacts of the same component not detected due to poor image, dust, etc.

In an eleventh step 610, the path-corrector 440 is arranged to receive the transformation data from the back-end 430 and provide corrective communication path layout data by using the designed communication path layout data 445. In the present embodiment, the path-corrector 440 is arranged to provide new communication path data, which comprises corrective communication paths to correct for the transformation of the contacts 340a-340h.

In the present embodiment, the new communication path data 445 comprises data that causes the printer 450, in an twelfth step 620, to print a corrective communication path 360, 365 between a first contact 330a of a component 330 and an eighth contact 340h of the translated component 340, as shown in FIG. 7a. FIG. 7b shows a larger representation of a corner region 300a of the module 300 shown in FIG. 7a. The path-corrector 440 is arranged therefore to provide corrective communication path data that takes into account the translation of the eight contact 340h of the translated component 340.

In the present embodiment the printed corrective communication path 360, 365 comprises the whole communication path (e.g. the designed communication path 365 and a corrective portion 360). However it will readily be appreciated that in alternative embodiment the corrective communication path 360, 365 may only comprise a portion 360 of the communication path 360, 365. This may occur when the designed communication path 365 has been printed prior to correction by the apparatus 400.

While in the above embodiment the corrective communication path payout data was used to provide a corrective communication path, which was a corrective conductive path, between components, in alternative embodiment the corrective communication path payout data may be used in a different manner.

FIG. 8 shows a portion of a circuit arrangement 800, similar to that described above. In this arrangement however the circuit arrangement is an optical module comprising a support 810 and an optical component 840 with an optical connector 840h. Here the optical component has displaced a distance 'x' in a similar manner to that above. The corrective communication path layout data obtain for this module 800 is then used to provide the corrective optical 860 path on the support.

FIG. 9a shows a portion of a circuit arrangement 900 similar to that described above. In this arrangement the circuit again an electronic module 900, which comprises a support 910 and an electronic component 940 with a communication contact 940h. Here the component has displaced a distance 'x' in a similar manner to that above. The corrective communication path layout data obtain for this module 900 is then used to provide the corrective insulating path 990 on the support 910. The corrective insulating path forms a path well 995.

FIG. 9b shows the portion of the circuit arrangement in which subsequently to the application of the corrective insulating path 990, a correct communication path 960 has been applied, which is a conductive path. The corrective communication path 960 has been applied in the path well 995 by depositing a conductive material, such as a conductive fluid, into the path wells 995 to harden, as will readily be appreciated by the skilled reader.

FIG. 10 shows an embodiment in which a corrective algorithm is used to correct the designed communication path layout data using transformation data. Such an embodiment may be used by the path-corrector 440, as described above. In this embodiment the designed communication path layout data is used to provide an electrically conductive path between electrical contacts of components on a module. A skilled reader will readily be able to adapt the following for semi-conductive, optical, insulating, etc. correction.

FIG. 10a shows an enlarged portion of an image 1000 of designed communication path layout data. The image 1000 comprises four communication contacts 1010, 1020. Each communication contact 1010, 1020 has at least one communication path 1060, 1070 associated therewith, provided, in the present embodiment, to cause a subsequent printer 450 to provide a conductive path 1060 between the communication contacts 1010, 1020 and other respective parts of a module.

FIG. 11 shows a flow diagram 1200 of the steps taken when using the corrective algorithm to provide a corrective communication path layout data based on the transformation data. In this embodiment, in a first step 1210, data pertaining to the new location of the actual contact 1030 (e.g. transformation data) is supplied to the algorithm. The transformation data has identified that one of the designed contacts 1020 has been displaced by some translated distance 'z' from the designed location, as shown in FIG. 10a.

In order to provide corrective communication path layout data, the designed communication path layout data is modified by using the transformation data in order to account for the said displacement 'z', as will be described herein.

In a second step 1220 the correction algorithm is used to erase the communication paths 1070 that, as a result of the displacement 'z', are now falsely orientated and instead of being connected to the actual contact 1030, are connected to the designed contact 1020.

Figure 10B:
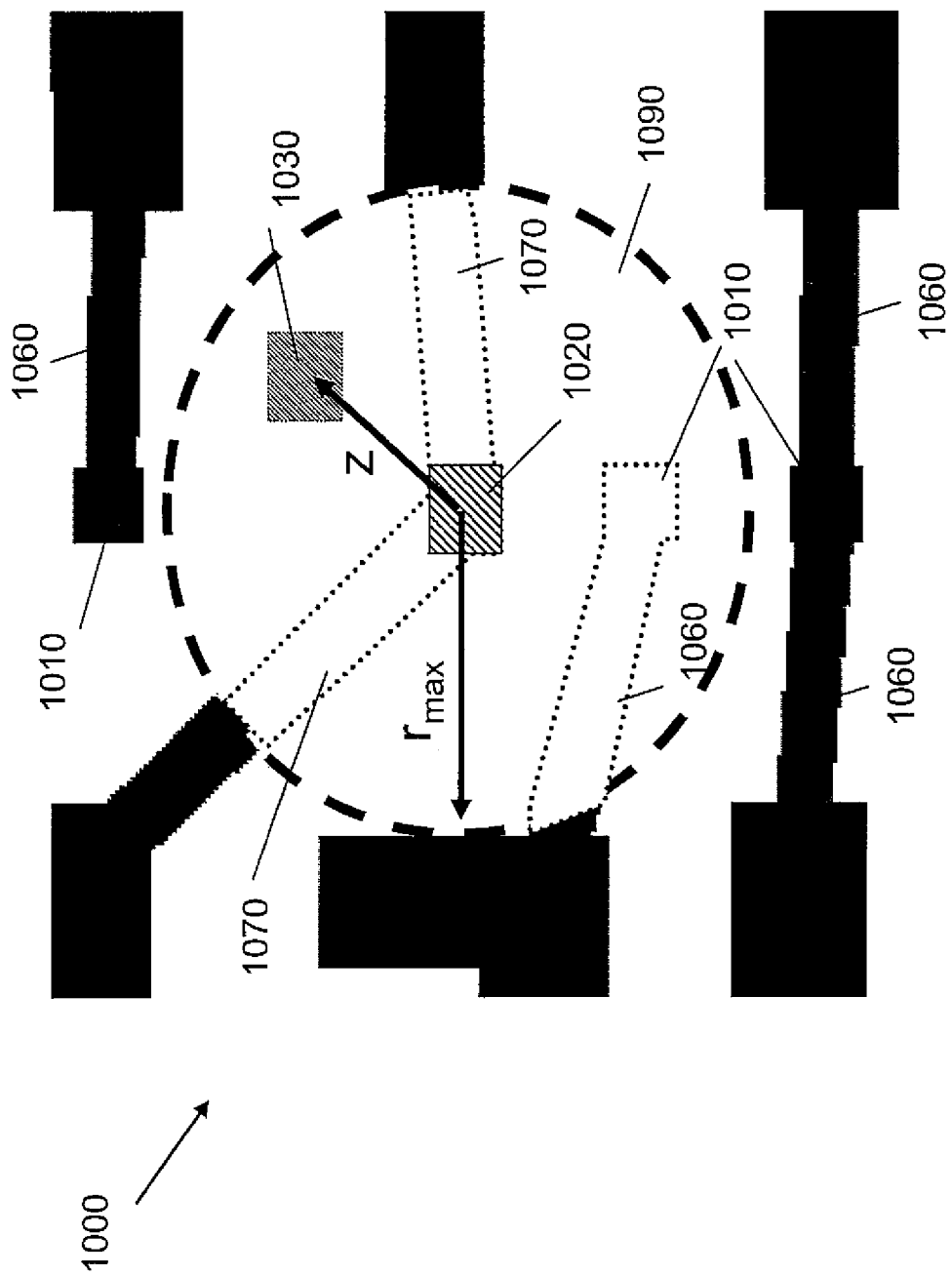
FIG. 10 shows portions of an image of designed communication path layout data and the steps taken in correcting for a displaced contact by using a corrective algorithm.

FIG. 10b shows this second step 1220 in which the erasing is achieved by providing an erasing radius, $r_{max}$. The erasing radius is arranged to provide an erasing region 1090 within which the present designed communication path layout data is erased. The erasing radius has its centre substantially at the centre of the designed contact 1020 in question. In the present embodiment the erasing radius is such that some communication paths 1060 that are provided for other contacts 1010 lie also with the said erasing radius.

Therefore, in a third step 1230 a flood fill operation based on a morphological reconstruction algorithm is used in a known manner to erase only the communication paths 1070 connected to the designed contact 1020 in question.

The skilled reader will readily be appreciated that the magnitude of the erasing radius is chosen depending on the scale of the communication paths 1060, 1070/module, etc. and the severity of the errors (e.g. the magnitude of the displacement 'z'). As will be appreciated if an erasing radius is too small the erasing region 1090 may be not be large enough for successful correction (as will be described in further detail below). On the other hand, if the erasing radius is too large and extends into tortuous parts of other communication paths 1060 provided in the designed communication path layout data, replacing the erased communication path 1070 with a corrective portion (e.g. corrective communication path) which may result communication paths and corrective portion overlapping each other, as will be readily appreciated.

Figure 10C:
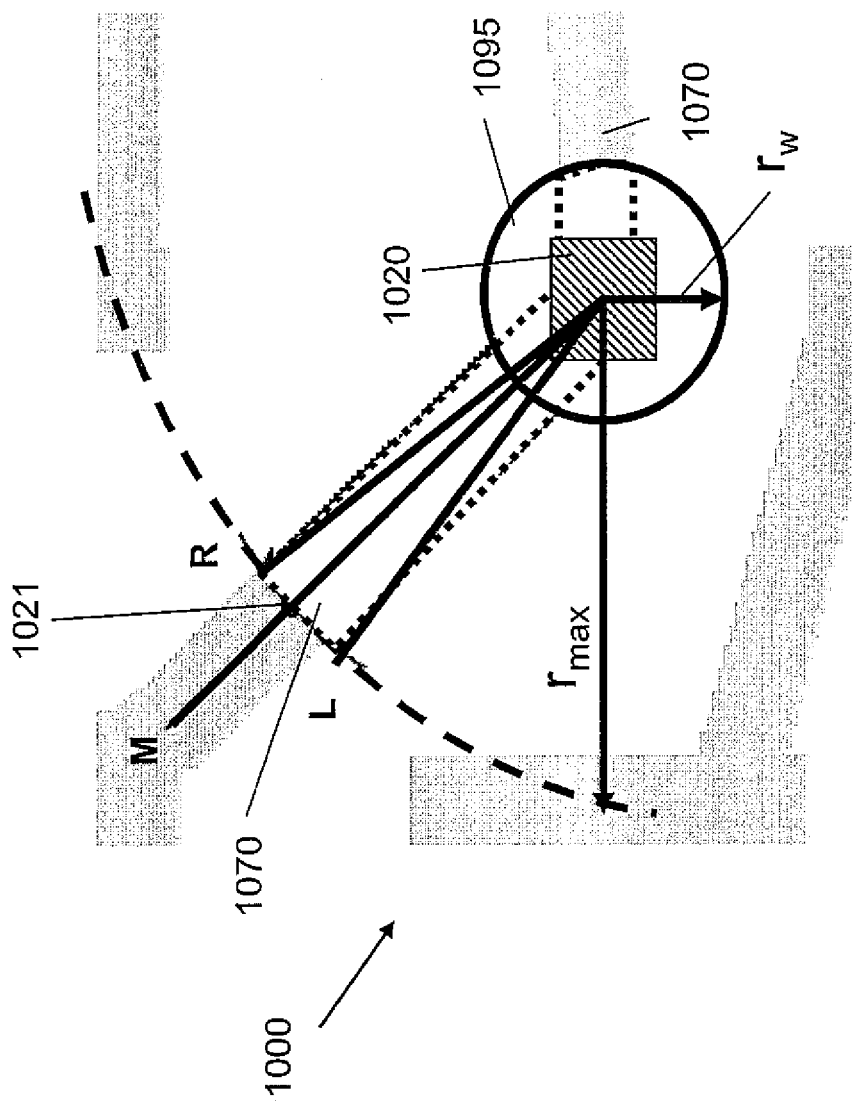

In a fourth step 1240, the particular communication paths 1070 that were identified as to be erased from the designed contact 1020 are detected, as shown in FIG. 10c for one communication path 1070 from the designed contact 1020. FIG. 10c shows an enlarged portion of FIGS. 10a and 10b.

To achieve this fourth step 1240, the correction algorithm is used to provide a correction radius, $r_w$, centred with the designed contact 1020 in the image 1000, so as to provide a correction region 1095. Each distinct artifact traversing a boundary formed by the circle at the correction radius, $r_w$, is considered as a distinct communication path 1070 for that designed contact 1020. In the present embodiment $r_w$ is smaller than the length of the shortest possible designed communication path connected to a contact 1010, 1020. It will be appreciated that in this regard very short communication paths can be detected. Similarly it will be appreciated that the correction radius, $r_w$, is however large enough for the circle formed to include the designed contact 1020 and the overlapping regions of the communication path 1070 to which it is connected.

The corrective algorithm is then used, in a fifth step 1250, to determine the point at which to begin a corrective communication path 1100 for the actual contact 1030 for each erased communication path 1070 connected to the designed contact 1020. As the crossing point of each designed communication path and the circle of radius $r_w$ is known, each designed communication path is selected, one by one, with the same flood fill operation as discussed above.

The direction of the starting point of the corrective conductive path 1100 is determined by determining the mean of the minimum and maximum angles between the designed contact 1020 and the locations of most distant designed communication path 1070 pixels. In the present embodiment the most distant designed communication path pixels are at a distance $r_{max}$ as shown in FIG. 10c. The minimum and maximum angles are obtained in FIG. 10c from two extended radii 'L', 'R', which extend from the designed contact 1020 to those points. Another extended radii 'M' represents their mean. At the point at which these radii L, R, M traverse the $r_{max}$ radius, and in particular the point 1021 at which M traverses the $r_{max}$ radius, the polar coordinates of the starting point of the corrective communication path 1100 are established.

Figure 10D:
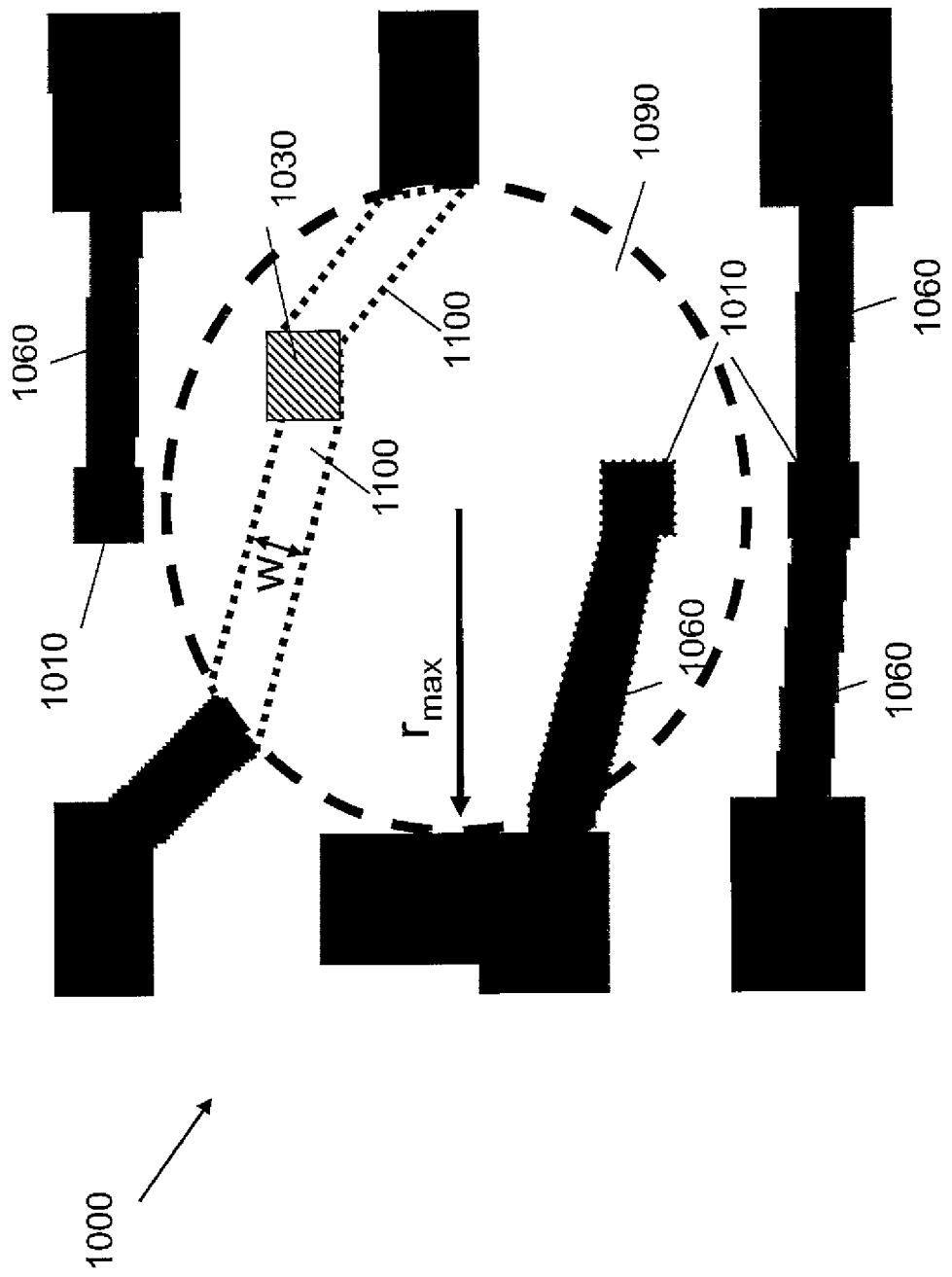

In a final step 1260 the corrective communication path 1100 from this point to the actual contact 1030 is provided. This is shown in FIG. 10d. In this arrangement the thickness of the corrective communication path 1100 is set by a constant value 'w'. The corrective algorithm is arranged to repeat the above detailed procedure for each displaced contact 1020. The thickness 'w' of the corrective communication path need not be a constant thickness and may vary along its length e.g. the start portion, an intermediate portion and the end portion of the corrective path may or may not have the same/different thickness.

It will readily be appreciated that in the above discussion erasing radius, $r_{max}$, and corrective radius, $r_w$, have been used. However the skilled reader will appreciate that this is exemplary only and in alternative embodiments radii need not be used. Indeed the erasing region 1090 and the corrective region 1095 may be any number of other shapes, such as triangular, rectangular, or any odd-shaped area. Similar while the embodiment above detailed the correction of a substantially 2D designed communication path layout data, a person skilled in the art would readily be able to implement similar for 3D layouts.

In addition, a person skilled in the art will readily appreciate that the above embodiments are intended to be exemplary only, and that many further uses of the correction communication path layout data may be envisaged. For example, the corrective communication path layout data may be used to apply a corrective semi-conductive path. The semi-conductive path may comprise more than one semi-conductive material. In such an arrangement, diodes, transistors of the like may be fabricated between communication contacts.

In some embodiments, the back-end 430 and/or the path-corrector 440 may be arranged to weight certain sets, or matched locations, such that the corrective communication path layout data in critical (tight) areas is modified less than in less crowded areas. Similarly, sets relating to one component may be weighed in relation to another.

Alternatively, or additionally, the apparatus 400 may be arranged such that the transformation data may be used to discard modules 300, 800, 900 in which the transformation is larger than a particular threshold, or to indicate that a more refined analysis is required at an earlier step or the like. A person skilled in the art will readily be able to implement such an arrangement.

While in the present embodiment the apparatus 400 is arranged to receive from the imager 410 an image of substantially the entire surface region 350 of the module 300, in other embodiments this need not be the case. The apparatus may be arranged to receive only a portion of the surface region 350, which may be 90%, 70%, 50% 25% 10% or 5% or the like, or any portion therebetween. In such an arrangement the imager 410 may be arranged to acquire and/or export an image of only a portion of the surface region 350, which may be 90%, 70%, 50% 25% 10% or 5% or the like, or any portion therebetween.

In some arrangements the front-end 420 may be arranged to discriminate between larger components, such as integrated circuits, and the support and smaller components. In this arrangement it may be deemed that any translation of the other components, which may be surface mount resisters, etc. would not be so serve so as to cause subsequent lack of continuity.

It will be appreciated to the skilled reader that the apparatus may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state).

It will be appreciated that the aforementioned circuitry may have other functions in addition to the mentioned functions, and that these functions may be performed by the same circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. A method comprising:
   determining a location of one or more feature(s) of one or more electronic component(s) of a circuit arrangement;
   determining, using a computer, one or more displacement(s), if any, of a location of one or more communication contact(s) associated with the one or more feature(s) of the one or more electronic component(s) of the circuit arrangement, from an expected location for the communication contact(s); and
   providing one or more corrective communication path(s) of said circuit arrangement,
   wherein the one or more corrective communication paths are provided by using transformation data, which is based upon the said one or more displacement(s) to update expected communication path layout data defining expected communication paths, in which the expected communication path layout data is updated using a corrective algorithm to provide corrective communication path layout data, and
   the corrective algorithm defines an erasing region for one or more of the expected communication paths, each of the one or more expected communication paths having a first portion inside the erasing region and a second portion outside the erasing region, erases the expected communication path layout data for the first portion(s) only, and provides a corrective portion for the expected communication path layout data to provide the corrective communication path layout data.

2. A method according to claim 1 wherein the one or more corrective communication path(s) are corrective insulating paths for correcting said one or more displacement(s).

3. A method according to claim 2 when the corrective insulating paths provide path wells, and the method further comprises filling the path wells with corrective communication paths.

4. A method according to claim 1 wherein determining the location of the one or more feature(s) of the one or more electronic component(s) of the circuit arrangement includes examining an image of the circuit arrangement acquired from an image sensor.

5. A method according to claim 1 wherein determining the location of the one or more feature(s) of the one or more electronic component(s) of the circuit arrangement includes examining one or more of two-dimensional and/or three-dimensional images of the circuit arrangement.

6. A method according to claim 1 wherein determining the location of the one or more feature(s) of the one or more electronic component(s) of the circuit arrangement comprises:
   discriminating between the one or more electronic components, said one or more electronic components being secured to a support of the circuit arrangement, and the support in an image of the circuit arrangement to identify the one or more electronic components; and
   identifying one or more feature(s) of the one or more identified electronic components.

7. A method according to claim 6 in which discriminating and/or identifying the feature includes comparing a characteristic of a portion of an image with a characteristic of a different portion of that image.

8. A method according to claim 1 in which the one or more electronic components are at least one of the following: electrical components; dielectric components; optical components; semi-conductive components.

9. A method according to claim 1 in which the one or more feature(s) are the one or more communication contact(s) of the one or more electronic component(s).

10. A method according to claim 1 wherein determining the location of the one or more feature(s) of the one or more electronic component(s) of the circuit arrangement comprises classifying the features to use in further feature examination and wherein the classification of features is used to classify the examined features using neural network technology into confirmed features and non-features.

11. A method according to claim 1 wherein determining the location of the one or more feature(s) of the one or more electronic component(s) of the circuit arrangement comprises observing at least of one of the translation, the scaling, the shearing and the rotation of the feature to determine the one or more displacement(s) of the location of said one or more communication contacts with respect to the expected location for the one or more communication contacts.

12. A method according to claim 1 in which the transformation data is weighted such that corrective communication path layout data associated with one area is modified less than corrective communication path layout data associated with another area.

13. A method according to claim 1 further comprising indicating that the circuit arrangement is to be rejected when the one or more displacement(s) of the location of said one or more communication contacts with respect to an expected location for the communication contact(s) is outside a particular threshold.

14. A method according to claim 13 wherein determining the location of the one or more feature(s) of the one or more electronic component(s) of the circuit arrangement further comprises providing transformation data based upon at least one of a translation, scaling, shearing, and rotation of the one or more feature(s) and in which rejecting the circuit arrangement occurs when the transformation data is outside a particular threshold.

15. A method according to claim 1 in which, the physical circuit arrangement comprises the one or more physical electronic component(s), secured to a support, and associated with the one or more communication contact(s), to allow for communicative connection of the respective physical electronic component, in which the support is a mould, in which the physical electronic components are one of partially and substantially embedded.

16. A method according to claim 1 comprising securing the one or more electronic components to a support when manufacturing the circuit arrangement.

17. A method according to claim 1 wherein the erasing region is centred around the expected location of one of the communication contacts.

18. A method according to claim 1 wherein the correction algorithm defines a correction region containing the expected location for a communication contact, and each distinct artifact traversing an outer boundary of the correction region is considered to be a distinct communication path for the communication contact.

19. A method according to claim 1 wherein the expected communication path layout data comprises pixel data.

20. A method according to claim 1 in which the one or more corrective communication path(s) are one or more of the following: conductive path; semi-conductive path; optical path.

21. A method comprising:
manufacturing a circuit arrangement having one or more physical communication path(s) and one or more physical electronic component(s) each having one or more communication contacts, a first one of the physical communication paths providing communication to an expected location of a first one of the communication contact(s) of a first one of said physical electronic components;
determining a location of one or more feature(s) of the first one of the electronic component(s) of the circuit arrangement;
determining, using a computer, a displacement of a location of the first one of the communication contact(s) of the first one of the electronic component(s) of the circuit arrangement from the expected location of the first one of the communication contact(s); and
providing a corrective communication path of the circuit arrangement to augment the first one of the physical communication path(s) of the circuit arrangement,
wherein the corrective communication path is based upon the displacement, and
the corrective communication path is provided between the location of the first one of the communication contact(s) and the expected location for the first one of the communication contact(s) to correct for the displacement.

22. A method according to claim 21 in which the one or more corrective communication path(s) are one or more of the following: conductive path; semi-conductive path; optical path.

23. An apparatus comprising:
manufacturing equipment configured to manufacture a circuit arrangement having one or more communication path(s) and one or more physical electronic component(s);
an input arranged to receive data relating to a determined location of one or more feature(s) of the one or more physical electronic component(s) of a circuit arrangement;
one or more processor(s) configured to cause the apparatus to:
determine one or more displacement(s), if any, of a location of one or more communication contact(s) associated with the one or more feature(s) of the one or more electronic component(s) of the circuit arrangement, from an expected location for the communication contact(s); and
provide one or more corrective conductive path(s) of said circuit arrangement,
wherein the one or more corrective communication path(s) are provided by using transformation data, which is based upon said one or more displacement(s) to update expected communication path layout data defining expected communication paths, in which the expected communication path layout data is updated using a corrective algorithm configured to provide corrective communication path layout data, the corrective algorithm being configured to define an erasing region for one or more of the expected communication paths, each of the one or more of the expected communication paths having a first portion inside the erasing region and a second portion outside the erasing region, erase the expected communication path layout data of the first portion(s) only and provide a corrective portion for the expected communication path layout data to provide the corrective communication path layout data.

24. A non-transitory machine-readable medium embodying a computer program comprising computer code arranged to control an apparatus according to claim 23 to provide a corrected conductive path layout of the circuit arrangement.

25. An apparatus according to claim 23 wherein the one or more corrective communication paths are provided between the location of the one or more communication contacts and the expected location for the communication contact(s) to correct for the said one or more displacement(s).

26. A method for providing one or more corrective communication path(s) of a circuit arrangement, the circuit arrangement having one or more physical communication path(s) and one or more electronic component(s) secured to a support, and associated with one or more communication contact(s), to allow for communicative connection of the respective electronic component, the method comprising:
   determining the location of one or more feature(s) of the one or more electronic component(s) of the circuit arrangement;
   determining, using a computer, one or more displacement(s), if any, of a location of said one or more associated communication contact(s) from an expected location for the communication contact(s), in which the one or more feature(s) are the one or more communication contact(s) of the one or more electronic component(s), and wherein the determining one or more displacement(s) comprises:
   discriminating between the one or more electronic components and the support in an image to identify the one or more electronic components; and
   identifying one or more feature(s) of the one or more identified electronic components to determine the one or more displacement(s); and
   providing the one or more corrective communication path(s) of said circuit arrangement,
   wherein the one or more corrective communication paths are provided by using transformation data, which is based upon the said one or more displacement(s) to update expected communication path layout data defining expected communication paths, in which the expected communication path layout data is updated using a corrective algorithm to provide corrective communication path layout data, and
   the corrective algorithm defines an erasing region for one or more of the expected communication paths, each of the one or more of the expected communication paths having a first portion inside the erasing region and a second portion outside the erasing region, erases the expected communication path layout data for the first portion(s) only and provides a corrective portion for the expected communication path layout data to provide the corrective communication path layout data.

\* \* \* \* \*